(12) United States Patent
Kanno

(10) Patent No.: US 11,868,653 B2
(45) Date of Patent: *Jan. 9, 2024

(54) MEMORY SYSTEM AND METHOD FOR CONTROLLING NONVOLATILE MEMORY

(71) Applicant: Kioxia Corporation, Minato-ku (JP)

(72) Inventor: Shinichi Kanno, Ota (JP)

(73) Assignee: Kioxia Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/122,760

(22) Filed: Mar. 17, 2023

(65) Prior Publication Data

US 2023/0221886 A1   Jul. 13, 2023

Related U.S. Application Data

(63) Continuation of application No. 17/223,094, filed on Apr. 6, 2021, now Pat. No. 11,669,269, and a continuation of application No. 16/126,038, filed on Sep. 10, 2018, now Pat. No. 11,003,385.

(30) Foreign Application Priority Data

Apr. 16, 2018 (JP) ................................. 2018-078422

(51) Int. Cl.
*G06F 3/00* (2006.01)
*G06F 3/06* (2006.01)
(52) U.S. Cl.
CPC .......... *G06F 3/0656* (2013.01); *G06F 3/0604* (2013.01); *G06F 3/0659* (2013.01); *G06F 3/0679* (2013.01)

(58) Field of Classification Search
CPC ............................. G06F 3/0656; G06F 3/0679
See application file for complete search history.

(56) References Cited

U.S. PATENT DOCUMENTS 6,272,143 B1   8/2001   Lin
6,418,515 B1   7/2002   Kurosawa
8,144,512 B2   3/2012   Huang

OTHER PUBLICATIONS

Mielke, N., et al. "Recovery Effects in the Distributed Cycling of Flash Memories", 2006 IEEE International Reliability Physics Symposium Proceedings, 2006, 7 pages.

(Continued)

*Primary Examiner* — Gurtej Bansal
*Assistant Examiner* — Michael L Westbrook
(74) *Attorney, Agent, or Firm* — Oblon, McClelland, Maier & Neustadt, L.L.P.

(57) ABSTRACT

According to one embodiment, a memory system stores write data received from a host to a shared write buffer for write destination blocks, acquires first write data for plural pages from the shared write buffer, and writes the first write data to a first write destination block by a first-step write operation. When receiving write data from the host in a state in which an empty region does not exist in the shared write buffer, the memory system discards write data in the shared write buffer in which the first-step write operation has been finished. In a case where the first write data do not exist in the shared write buffer when a second-step write operation of the first write data is to be executed, the memory system transmits a request to acquire the first write data to the host.

20 Claims, 17 Drawing Sheets

(56) References Cited

OTHER PUBLICATIONS

Zhang, Y., et al. "De-indirection for Flash-based SSDs with Nameless Writes", 10th USENIX Conference on File and Storage Technologies (FAST '12), https://www.usenix.org/system/files/conference/fast12/zhang.pdf , 2012, 16 pages.

"Open-Channel Solid State Drives Specification", (Revision 2.0), http://lightnvm.io/docs/OCSSD-2_0-20180129.pdf, 2018, 29 pages.

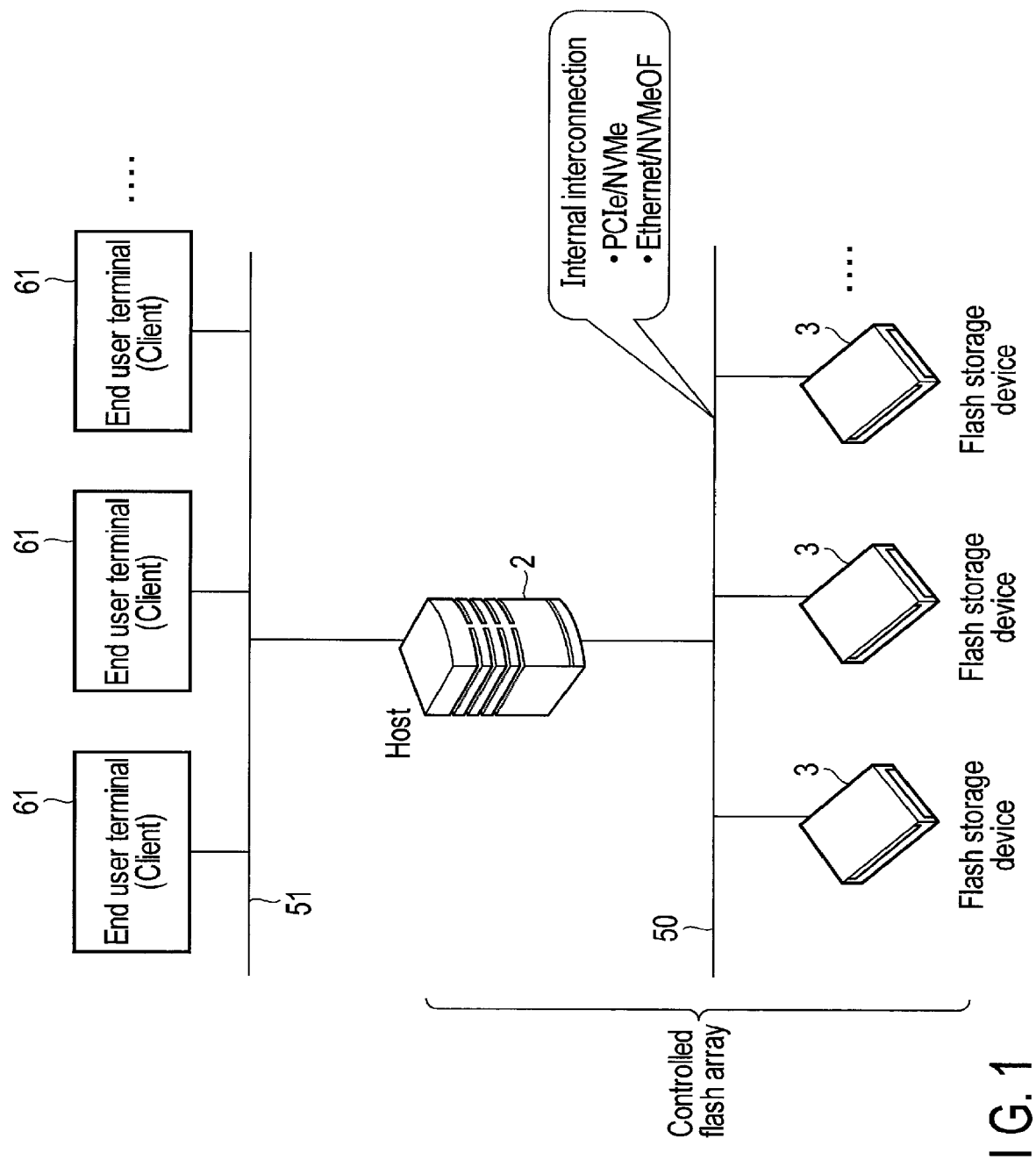
F I G. 1

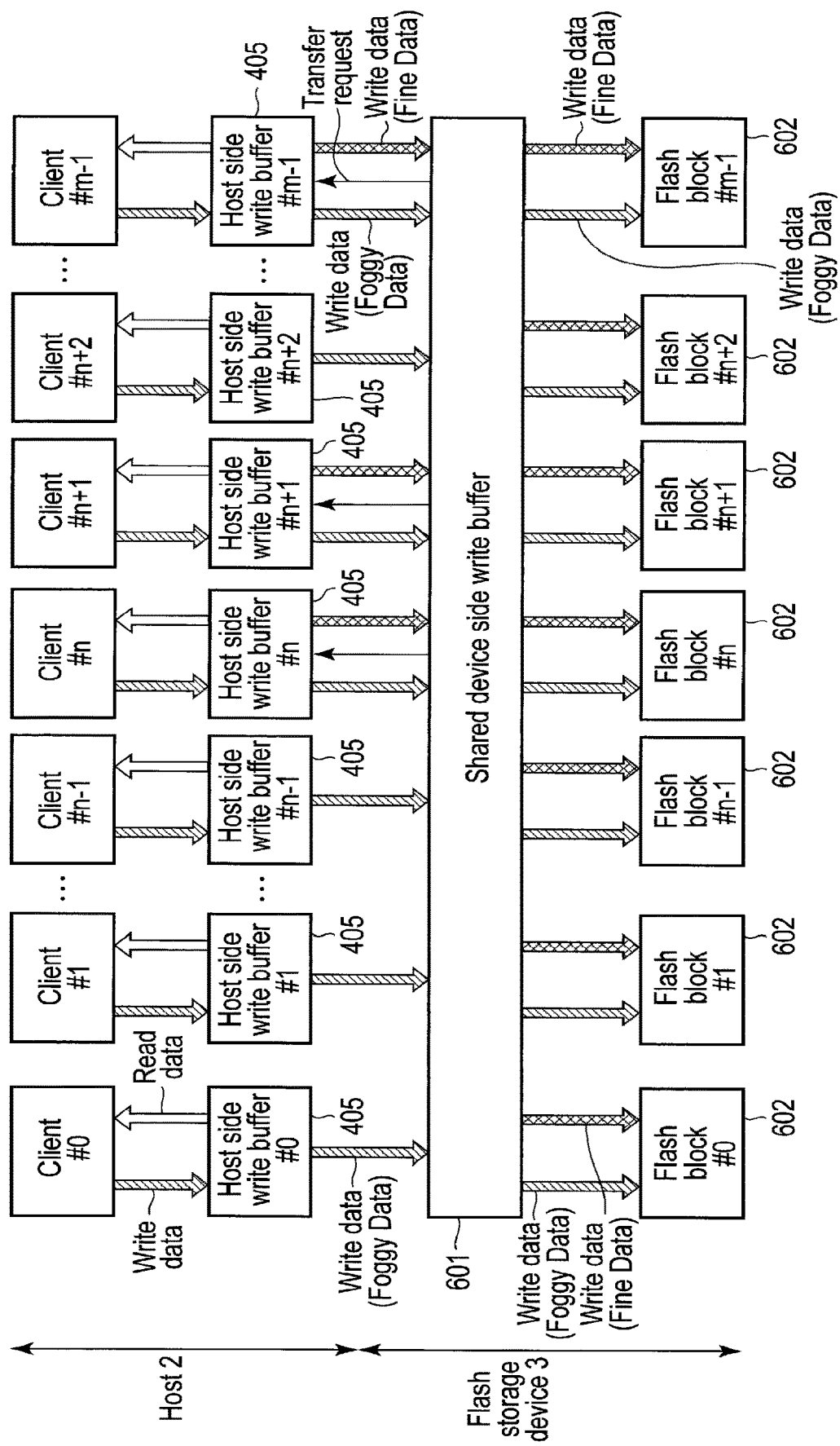
F I G. 3

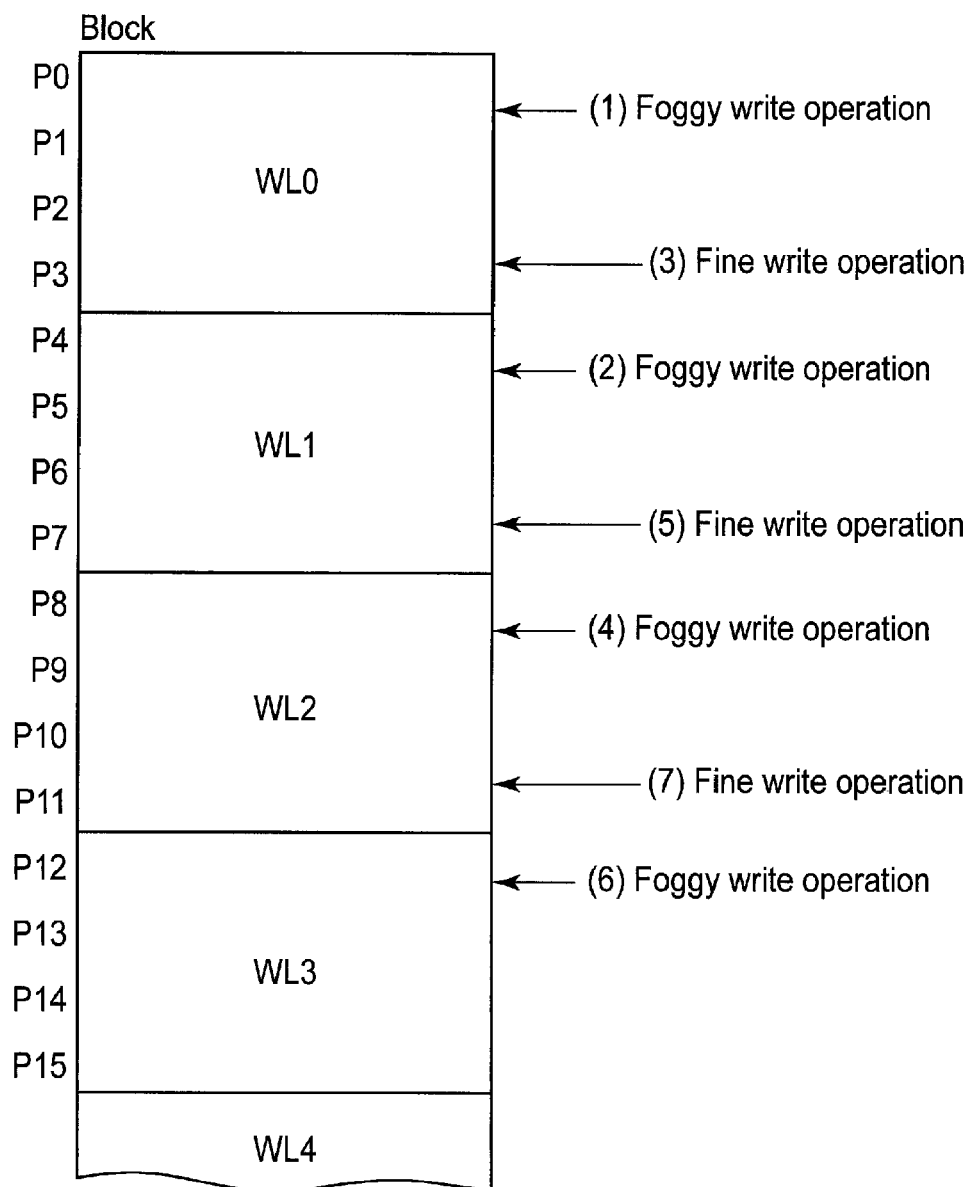
F I G. 5

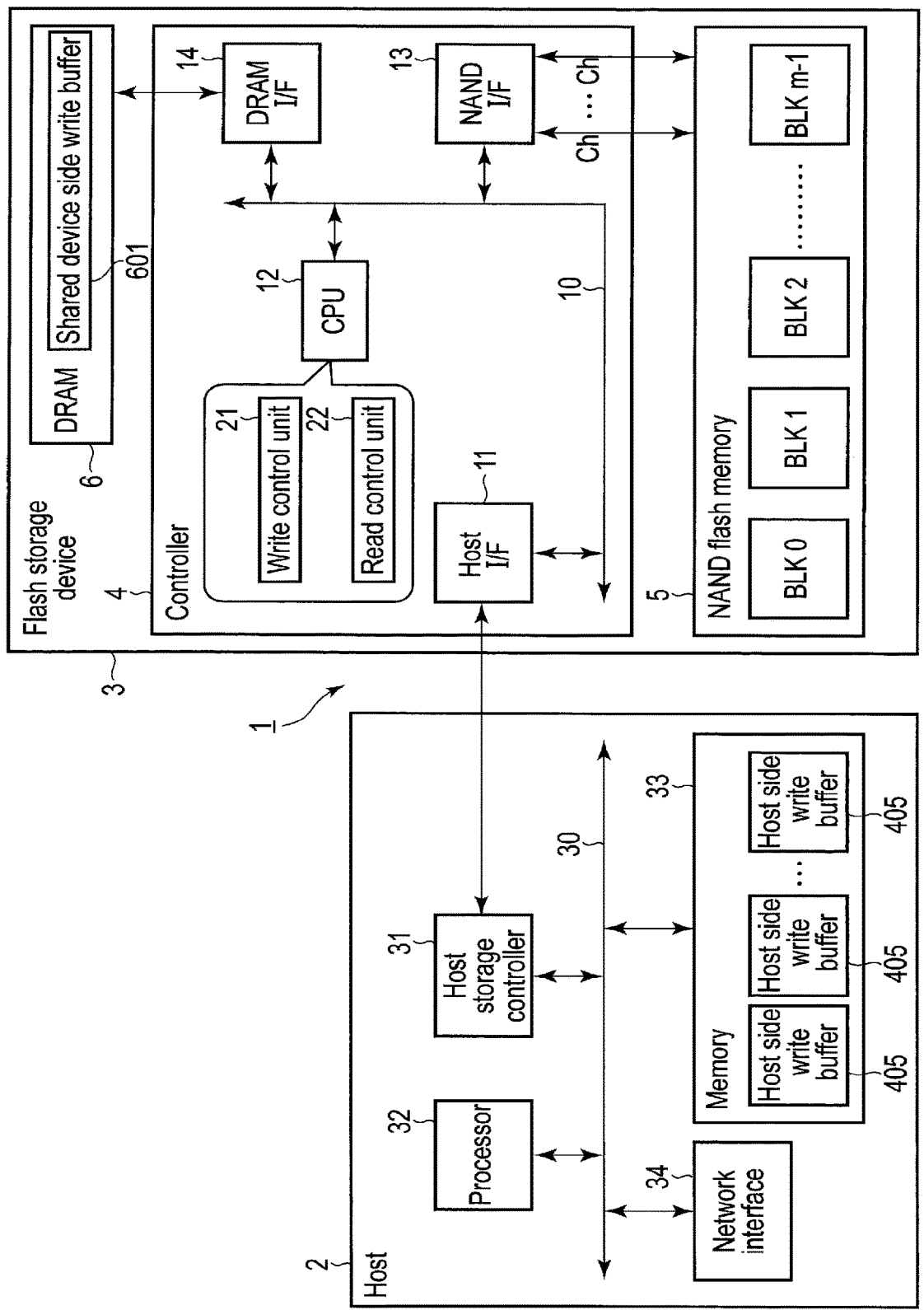
F I G. 6

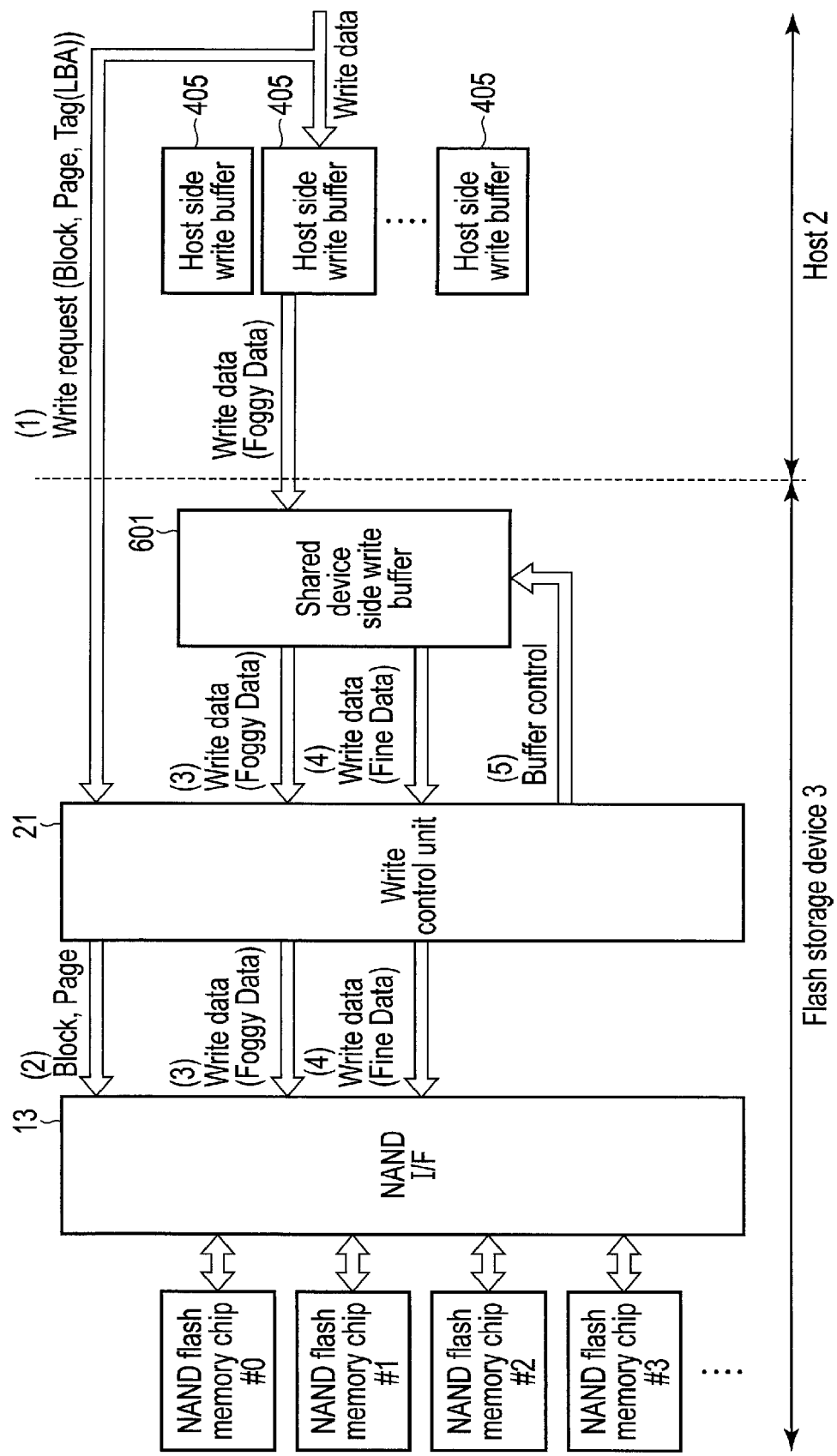
F I G. 9

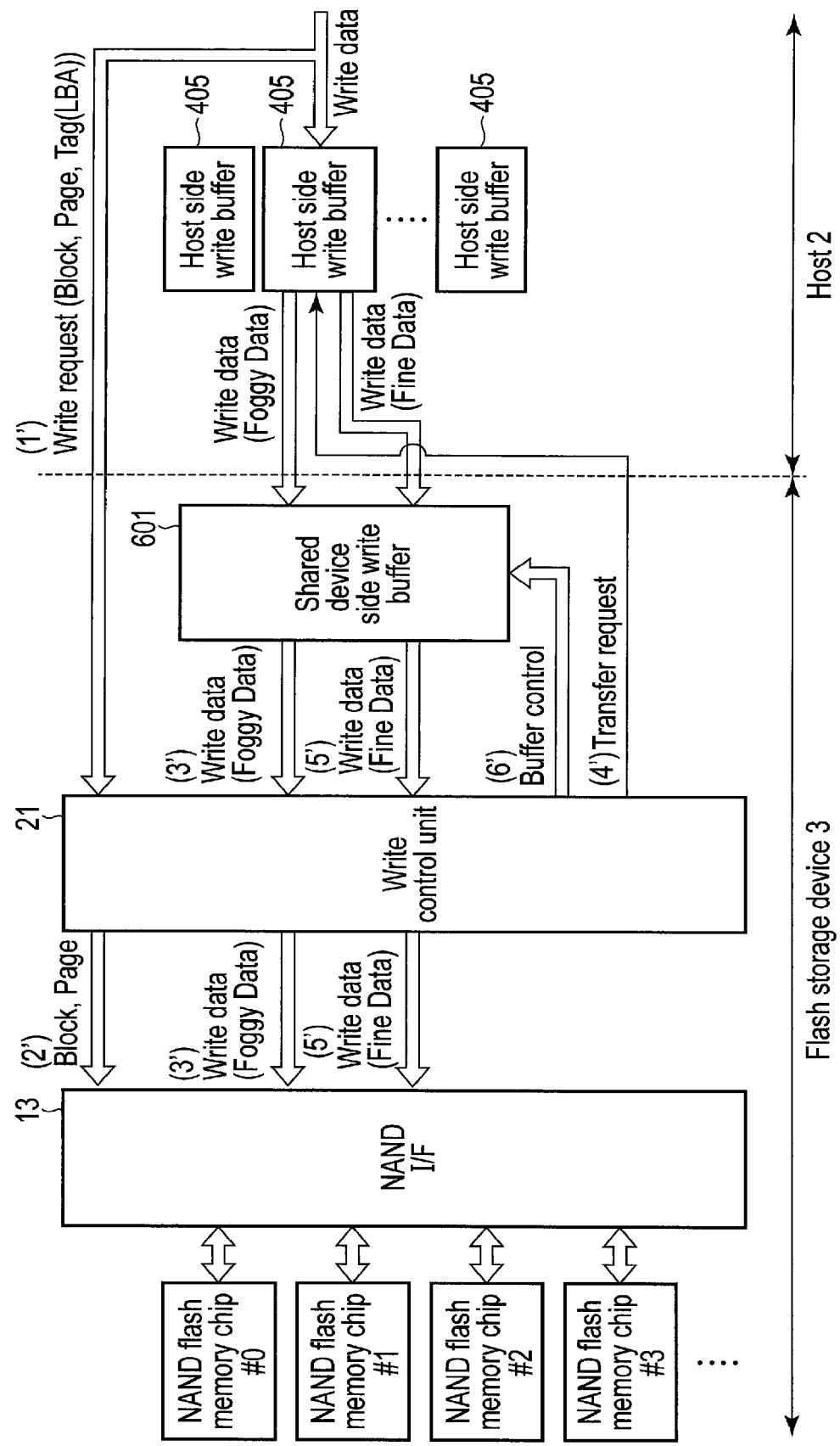
F I G. 10

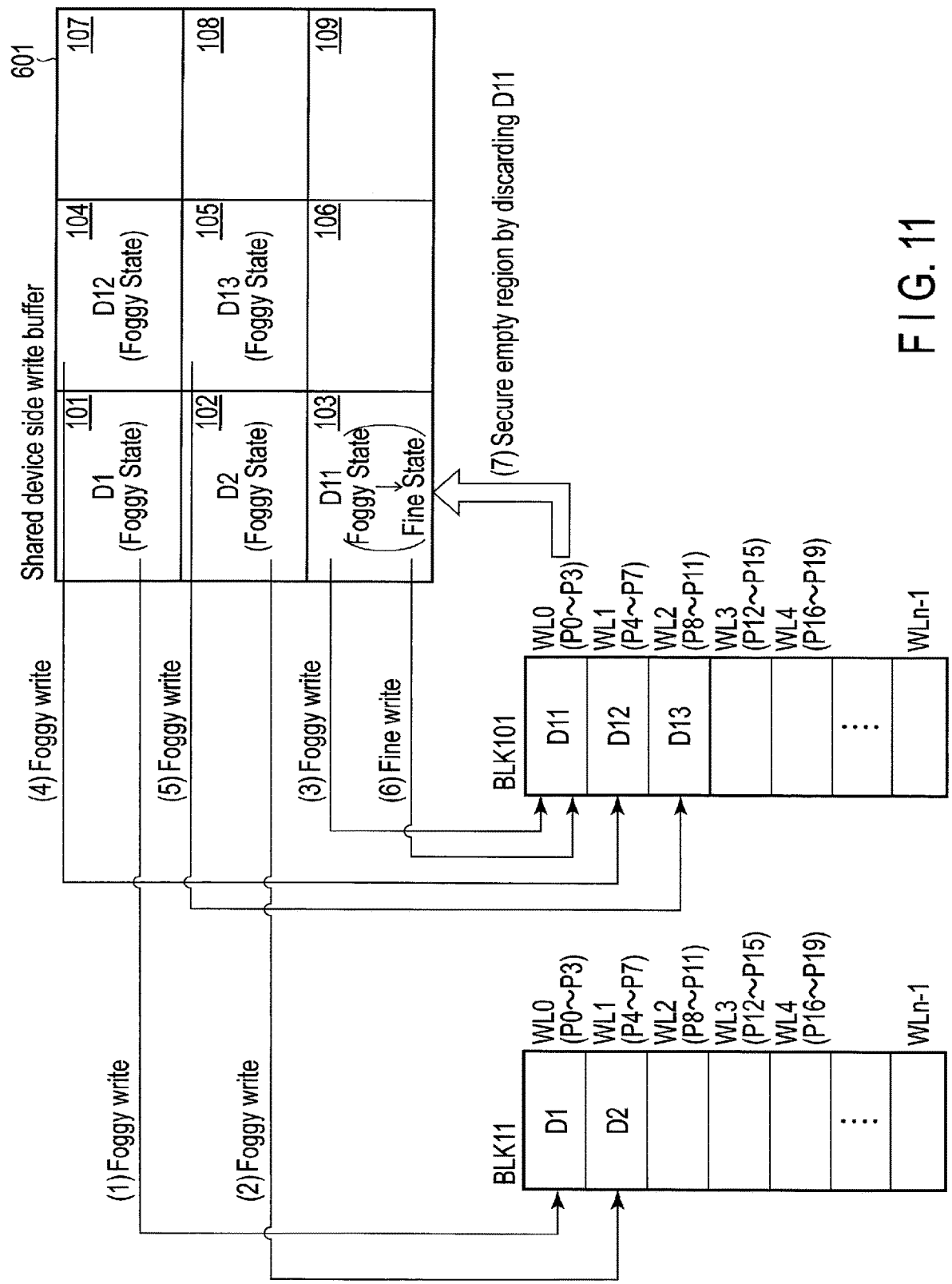
F I G. 11

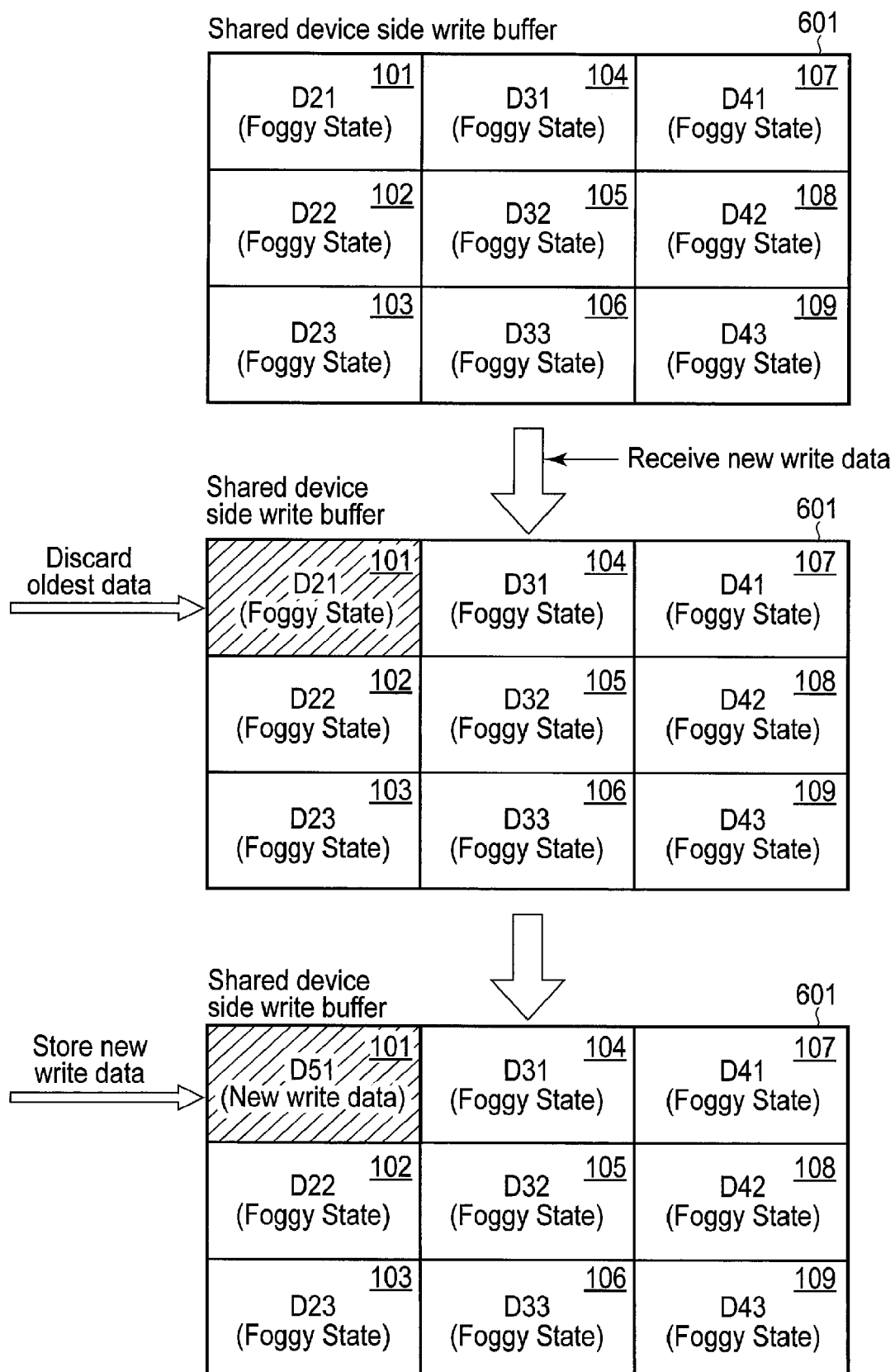
F I G. 12

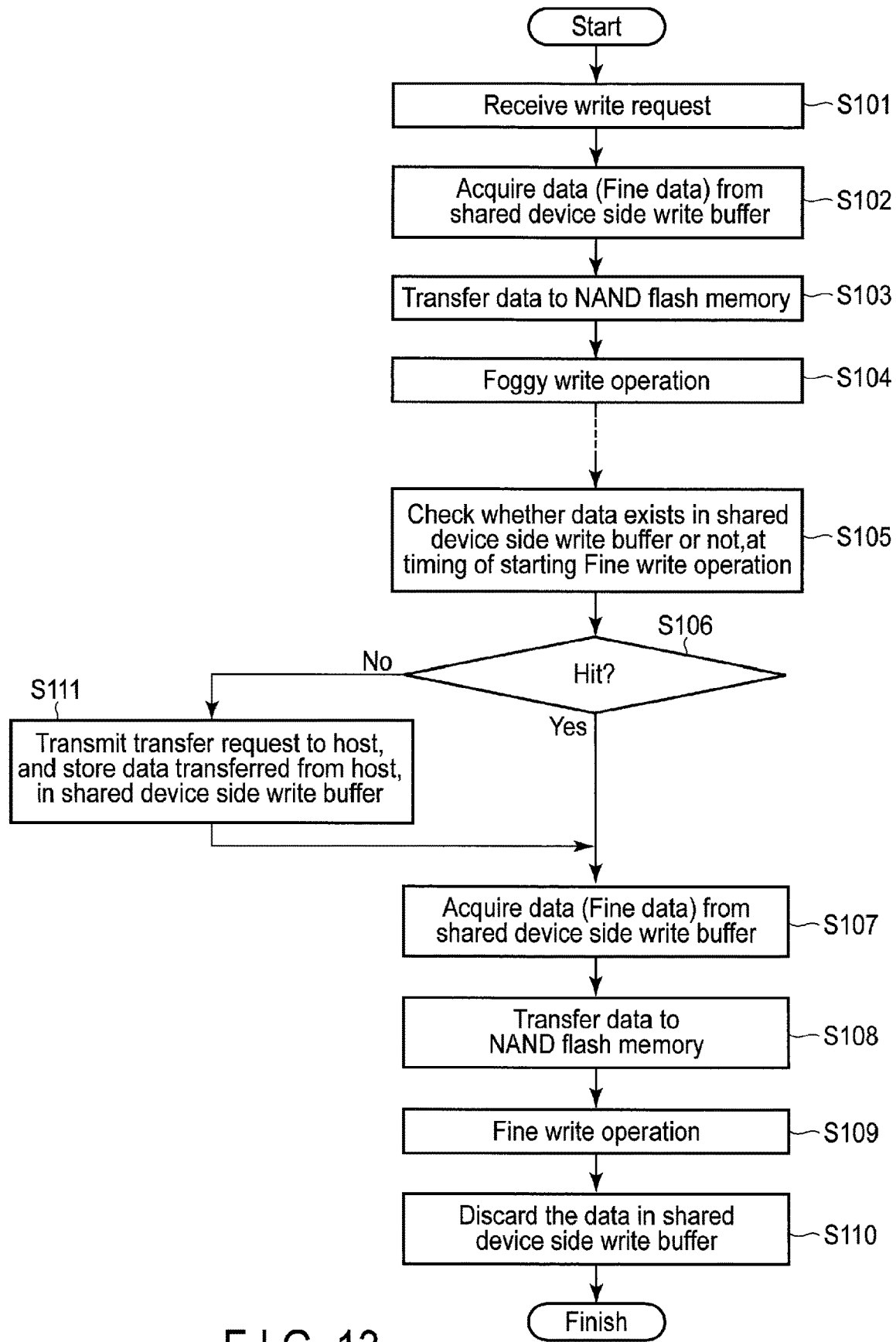
F I G. 13

Block allocate command

|  | Description |
|---|---|
| Command ID | Command ID for block allocate |
|  | Host requires device to allocate free blocks and can thereby acquire block address from device |

F I G. 15

Response to block allocate command

|  | Description |
|---|---|
| Block address | Device selects block to be allocated to host, from free block list, and returns block address of selected block to host |

F I G. 16

Write command

|  | Description |
|---|---|
| Command ID | Command ID for write command |
| Block address | Physical address designating block to which data are to be written |
| Tag | Identifier of data to be written |
| Length | Length of data to be written |

F I G. 17

Response to write command

| | Description |
|---|---|
| Page address | Physical address designating page to which data is written |
| Length | Length of data which is written |

F I G. 18

Read command

| | Description |
|---|---|
| Command ID | Command ID for read command |
| Tag | Identifier of data to be read |
| Block address | Designate block where data to be read is stored |
| Page address | Designate page where data to be read is stored |
| Length | Length of data to be read |

F I G. 19

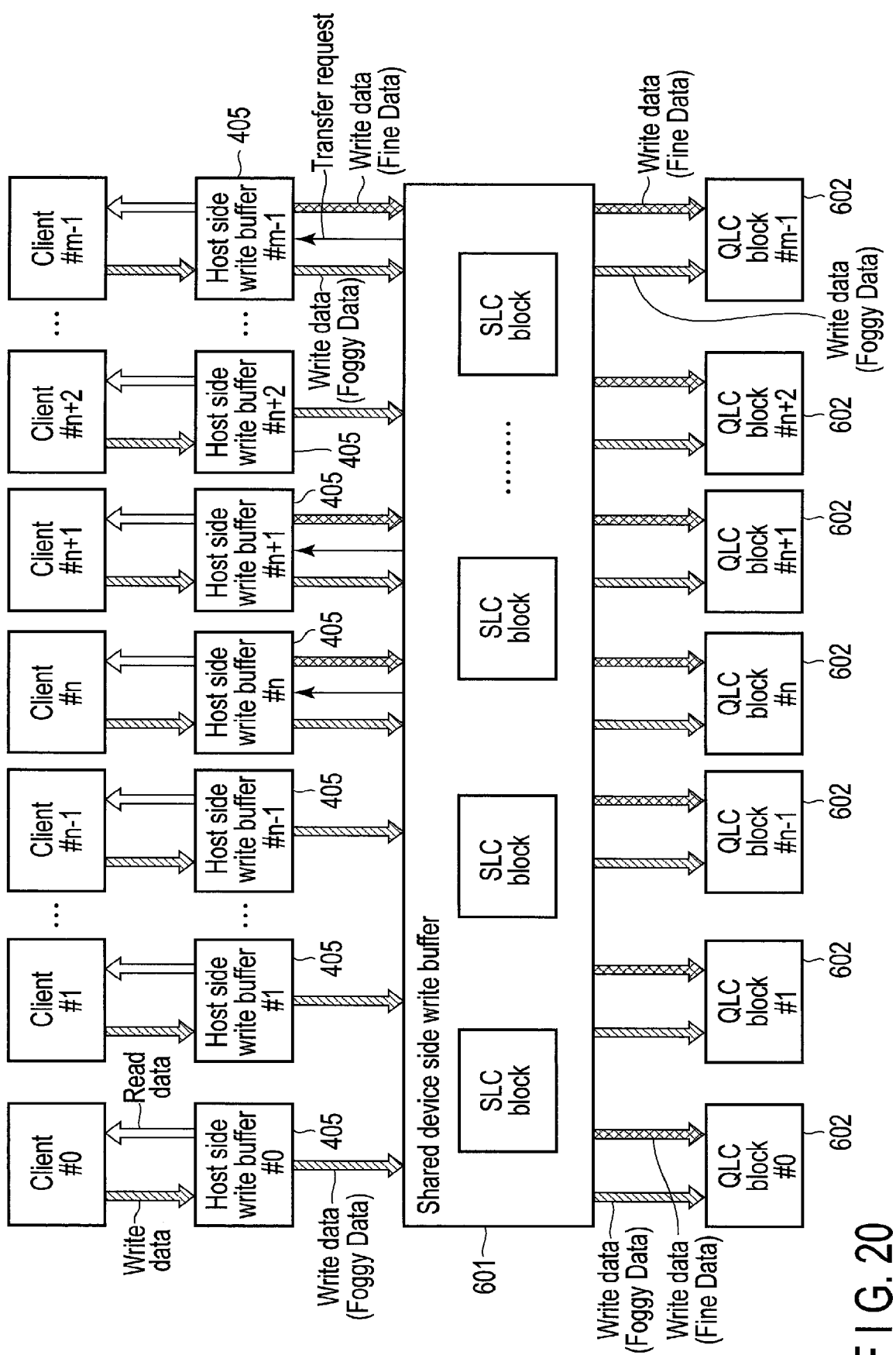
F I G. 20

MEMORY SYSTEM AND METHOD FOR CONTROLLING NONVOLATILE MEMORY

CROSS-REFERENCE TO RELATED APPLICATIONS

This application is a continuation of and claims the benefit of priority under 35 U.S.C. § 120 from U.S. application Ser. No. 17/223,094 filed Apr. 6, 2021, which is a continuation of U.S. application Ser. No. 16/126,038 filed Sep. 10, 2018 (now U.S. Pat. No. 11,003,385 issued May 11, 2021), and claims the benefit of priority under 35 U.S.C. § 119 from Japanese Patent Application No. 2018-078422 filed Apr. 16, 2018, the entire contents of each of which are incorporated herein by reference.

FIELD

Embodiments described herein relate generally to a technology of controlling a nonvolatile memory.

BACKGROUND

In recent years, memory systems comprising nonvolatile memories have been widely prevalent. As such a memory system, a solid state drive (SSD) based on a NAND flash technology is known.

In a server of a data center, too, a memory system such as SSD is used as a storage device.

In the memory system employed in a computing system such as a server, the computing system functions as a host of the memory system. For this reason, the memory system is required to process more I/O as the number of end users (clients) using this computing system increases. In addition, the data amount transferred from the computing system which is the host to the memory system, i.e., data traffic tends to increase as the number of clients increases.

BRIEF DESCRIPTION OF THE DRAWINGS

FIG. 1 is a block diagram showing a relationship between a host and a memory system of an embodiment.

FIG. 3 is a block diagram showing an operation of writing data to each write destination block, which is executed by the memory system of the embodiment by using the shared write buffer.

FIG. 5 is a diagram for explanation of a foggy fine write operation in a case of writing in two word lines back and forth.

FIG. 6 is a block diagram showing a configuration example of a computing system comprising the host and the memory system of the embodiment.

FIG. 9 is a block diagram for explanation of an example of write processing executed by the host and the memory system of the embodiment.

FIG. 10 is a block diagram for explanation of another example of write processing executed by the host and the memory system of the embodiment.

FIG. 11 is a block diagram for explanation of processing of discarding data in the shared write buffer and the foggy fine write operation executed by the memory system of the embodiment by using the shared write buffer.

FIG. 12 is a diagram for explanation of processing of discarding data in the shared write buffer in which the foggy write operation has been finished, which is executed by the memory system of the embodiment if an unused region does not exist in the shared write buffer.

FIG. 13 is a flowchart showing a procedure of data write processing executed by the memory system of the embodiment.

FIG. 15 is a table for explanation of a block allocate command (block allocate request) applied to the memory system of the embodiment.

FIG. 16 is a table for explanation of a response to the block allocate command.

FIG. 17 is a table for explanation of a write command applied to the memory system of the embodiment.

FIG. 18 is a table for explanation of a response to the write command.

FIG. 19 is a table for explanation of a read command applied to the memory system of the embodiment.

FIG. 20 is a block diagram showing an operation of writing data to each write destination block, which is executed by the memory system of the embodiment by using the shared write buffer composed of one or more SLC blocks.

DETAILED DESCRIPTION

Figure 2:
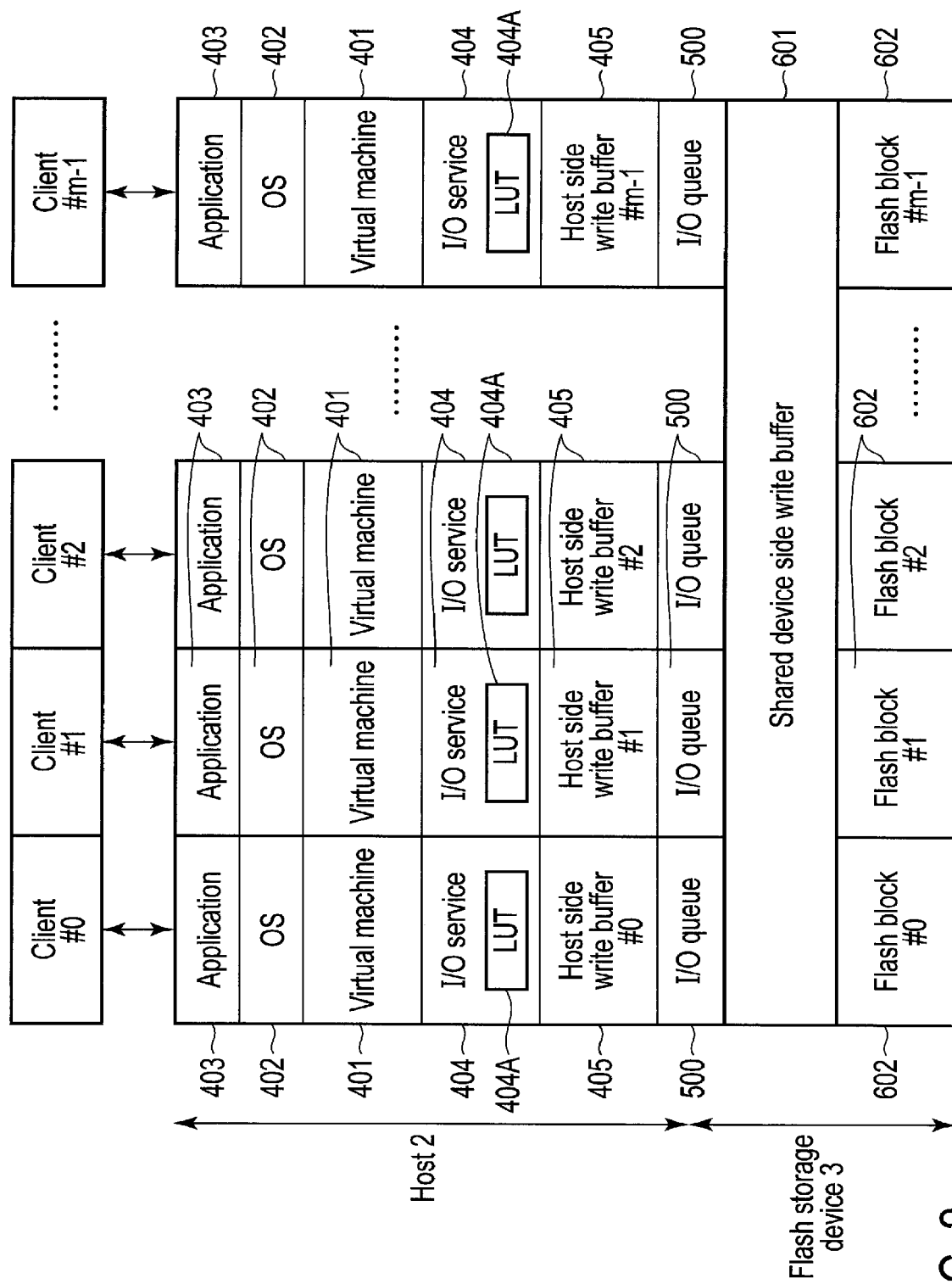
FIG. 2 is a diagram showing a relationship between plural write buffers provided on the host (i.e., host side write buffers) and a shared write buffer provided in the memory system of the embodiment.

Various embodiments will be described hereinafter with reference to the accompanying drawings.

In general, according to one embodiment, a memory system connectable to a host, comprises a nonvolatile memory including a plurality of blocks, and a controller. The controller is electrically connected to the nonvolatile memory and is configured to execute a multi-step write operation including at least a first-step write operation and a second-step write operation, the multi-step write operation transferring same data for plural pages to the nonvolatile memory at plural times.

The controller receives, from the host, write data stored in any one of a plurality of write buffers on a memory included in the host, which correspond to a plurality of write destination blocks allocated from the plurality of blocks, and stores the received write data in a shared write buffer shared by the write destination blocks, every time the controller receives a write request from the host. The controller acquires first write data for plural pages which are to be written to a first write destination block in the write destination blocks, from the shared write buffer, and writes the first write data to the first write destination block by the first-step write operation.

When receiving write data from the host in a state in which an empty region does not exist in the shared write buffer, the controller discards write data in the shared write buffer in which the first-step write operation has been finished to secure the empty region in the shared write buffer.

In a case where the first write data do not exist in the shared write buffer when the second-step write operation of the first write data is to be executed, the controller acquires the first write data from the host by transmitting a request to acquire the first write data to the host.

First, a relationship between a host and a memory system according to an embodiment will be explained with reference to FIG. 1. The memory system is a semiconductor storage device configured to write data to a nonvolatile memory and to read data from the nonvolatile memory. The memory system is implemented as a flash storage device 3 based on the NAND flash technology.

The host (host device) 2 is configured to control plural flash storage devices 3. The host 2 is implemented by a computing device configured to use a flash array composed of the plural flash storage devices 3 as a storage.

In the following explanations, the computing device such as a server computer is assumed to function as the host 2.

The host (server computer) 2 and the plural flash storage devices 3 are interconnected via an interface 50 (internal interconnection). PCI Express (PCIe) (registered trademark), NVM Express (NVMe) (registered trademark), Ethernet (registered trademark), NVMe over Fabrics (NVMeOF) and the like may be used for the interface 50 for the interconnection, but the interface 50 is not limited to these examples.

A typical example of the server computer which functions as the host 2 is a server computer (hereinafter, referred to as a server) in a data center.

In a case where the host 2 is implemented by the server in the data center, the host (server) 2 may be connected to plural end user terminals (clients) 61 via a network 51. The host 2 can provide various services to the end user terminals 61.

Examples of services which can be provided by the host (server) 2 are (1) Platform as a Service (PaaS) which provides a system running platform to each client (each end user terminal 61), (2) Infrastructure as a Service (IaaS) which provides an infrastructure such as a virtual server to each client (each end user terminal 61), and the like.

Plural virtual machines may be executed on a physical server functioning as the host (server) 2. Each of the virtual machines running on the host (server) 2 can function as a virtual server configured to provide various services to several corresponding clients (end user terminals 61).

The host (server) 2 comprises a storage management function of managing plural flash storage devices 3 constituting a flash array, and a front-end function of providing various services including the storage access to the end user terminals 61.

Each flash storage device 3 includes a nonvolatile memory such as a NAND flash memory. Each flash storage device 3 manages plural write destination blocks allocated from the blocks provided in the nonvolatile memory. The write destination blocks refer to the blocks to which data should be written.

The plural write destination blocks managed by the flash storage device 3 are used by plural clients using the host (server) 2, respectively. Data corresponding to a certain client is written to one or more write destination blocks, and data corresponding to the other client is written to one or more other write destination blocks.

If only one flash storage device 3 is connected to the host (server) 2, the same number of blocks as the total number of clients using the host (server) 2 or more blocks are allocated as write destination blocks.

In contrast, if the plural flash storage devices 3, for example, eight flash storage devices 3 are connected to the host (server) 2 and if the host 2 equally allocates the same number of clients to eight flash storage devices 3, the blocks whose number is one eighth as large as the total number of clients may be allocated as the write destination blocks, in each of the flash storage devices 3.

The NAND flash memory is configured to write data of plural bits to each memory cell, and data for plural pages to be written to the write destination blocks need to be held for each write destination block.

Therefore, in the environment where a plurality of write destination blocks available at the same time are present in the flash storage device 3, it is necessary to prepare the same number of write buffers as the number of write destination blocks. In other words, the same number of write buffers as the number of clients need to be prepared.

In addition, in modern NAND flash memories, to reduce program disturb, a multi-step write operation of transferring the same data for plural pages to the NAND flash memory at plural times may be applied to the NAND flash memories. The multi-step write operation includes at least a first-step write operation and a second-step write operation.

In the first-step write operation, data for plural pages are transferred to the NAND flash memory, and written to plural memory cells connected to the same word line in a certain write destination block in the NAND flash memory. In the second-step write operation, these data for plural pages are re-transferred to the NAND flash memory, and written to the plural memory cells in the write destination block. One of typical examples of the multi-step write operation of transferring the same data at plural times is foggy fine write operation.

In general, in the multi-step write operation such as the foggy fine write operation, the data write operation is executed while writing the data to plural word lines back and forth to reduce program disturb which results from the interference between the word lines.

For example, in the foggy fine write operation of writing the data to three word lines back and forth, first write data for plural pages are transferred to the NAND flash memory and then the first write data are written to a first physical page (i.e., plural memory cells connected to the first word line) (foggy write operation). Next, second write data for plural pages are transferred to the NAND flash memory and then the second write data are written to the next physical page (i.e., plural memory cells connected to the next word line) (foggy write operation). Next, third write data for plural pages are transferred to the NAND flash memory and then the third write data are written to the further next physical page (i.e., plural memory cells connected to the further next word line) (foggy write operation). Then, the physical page of the write target is returned to the first physical page (i.e., the plural memory cells connected to the first word line), the above-mentioned first write data for plural pages are re-transferred to the NAND flash memory, and then the first write data are written to the first physical page (i.e., the plural memory cells connected to the first word line) (fine write operation).

Therefore, in the case of executing the multi-step write operation such as the foggy fine write operation, data for the number of pages represented by a product of the number of bits to be written to one memory cell and the number of word lines to which the data is written back and forth need to be held in the write buffer in each write destination block.

Furthermore, in fact, the data are frequently written parallel to the plural blocks to achieve a higher data write speed. In this case, the amount of data necessary to be held in each write buffer is further increased.

Thus, in the case where the flash storage device 3 is shared by plural clients, the write buffer needs to be prepared for each client, i.e., each write destination block, and the data for a number of pages need to be held in each client buffer.

In general, however, since the capacity of the random access memory in the flash storage device 3 is limited, a sufficient number of write buffers each having a sufficient capacity may hardly be prepared on the random access memory in the flash storage device 3.

In addition, even if a large-capacity random access memory is provided in the flash storage device 3, the large-capacity random access memory results in being useless in a case where the number of clients sharing the flash storage device 3 is small.

For this reason, in the embodiment, a predetermined storage region on the memory included in the host 2 is used as plural write buffers which correspond to the write destination blocks, respectively. Since the plural write destination blocks correspond to the plural clients, respectively, the plural write buffers correspond to the plural clients, respectively.

The number of write buffers prepared on the memory of the host 2 is the same as the number of the write destination blocks, i.e., the number of clients. In the host 2, write data from a certain client are stored in a write buffer corresponding to this client. In addition, write data from the other client are stored in the other write buffer corresponding to the other client.

In general, the maximum memory capacity that can be managed by the host 2 is several terabytes while the maximum memory capacity that can be managed by the flash storage device 3 is approximately 4 gigabytes. Therefore, write buffering using the write buffer on the host 2 side enables the number of clients using the host 2 to easily increase, as compared with write buffering using the write buffer on the flash storage device 3 side.

In many modern NAND flash memories, however, the multi-step write operation such as the foggy fine write operation is required to be executed as explained above, to reduce program disturb. In this case, since the same data need to be transferred to the NAND flash memories at plural times, the same data need to be transferred from the host 2 to the flash storage device 3 at plural times if the configuration of using the host side write buffer alone is used. Thus, the amount of data which need to be transferred from the host 2 to the flash storage device 3, i.e., the data traffic between the host 2 and the flash storage device 3 increases and, consequently, the I/O performance may be degraded.

Thus, in the embodiment, a write buffer shared by plural write destination blocks (i.e., shared device side write buffer) is prepared in the flash storage device 3. Every time the controller provided in the flash storage device 3 receives the write request from the host 2, the controller receives the write data stored in any one of plural write buffers on the host side, from the host 2, and stores the received write data in the shared device side write buffer in the flash storage device 3. In other words, any write data are stored in the shared device side write buffer, irrespective of the write destination block to which the write data is to be written.

The controller of the flash storage device 3 writes the write data to the NAND flash memory by the multi-step write operation such as the foggy fine write operation. The multi-step write operation includes at least a first-step write operation such as the foggy write operation and a second-step write operation such as the fine write operation. The foggy write operation is a write operation of roughly setting a threshold distribution of each memory cell, while the fine write operation is a write operation of adjusting the threshold distribution of each memory cell. Furthermore, an intermediate write operation may be executed between the foggy write operation and the fine write operation.

The controller of the flash storage device 3 acquires the write data (first write data) for plural pages which are to be written to a certain write destination block of the plural write destination blocks, from the shared device side write buffer, and writes the first write data to the write destination block by the first-step write operation such as the foggy write operation.

To enable the write data from the host 2 to be efficiently stored in the shared device side write buffer, when receiving new write data from the host 2 in a state in which the shared device side write buffer includes no empty regions, the controller of the flash storage device 3 discards write data in the shared device side write buffer in which the first-step write operation such as the foggy write operation has been finished (i.e., foggy-state write data), and thereby secures an empty region in which the new write data can be stored, in the shared device side write buffer. For example, when receiving new write data from the host 2 in a state in which the whole shared device side write buffer is filled with the foggy-state write data, the controller of the flash storage device 3 selects specific write data which is to be discarded, among the foggy-state write data, and discards the selected write data. Thus, a large amount of write data corresponding to plural clients can be efficiently stored in the shared device side write buffer having the limited capacity.

Then, if the first write data do not exist in the shared device side write buffer at the time when the second-step write operation such as the fine write operation of the first write data is to be executed, the flash storage device 3 acquires the first write data from the host 2 by transmitting a request for acquiring the first write data (transfer request) to the host 2.

The shared device side write buffer has a certain limited capacity but, if the number of clients using the host 2 is a certain number or less, the probability (hit rate) at which the first write data exist in the shared device side write buffer when the second-step write operation is to be executed is comparatively high. Therefore, the multi-step write operation such as the foggy fine write operation can be executed without transferring the same write data from the host 2 to the flash storage device 3 at plural times. Thus, since the data traffic between the host 2 and the flash storage device 3 can be reduced, the I/O performance of the flash storage device 3 can be improved as compared with a case of transferring the same write data from the host 2 to the flash storage device 3 at plural times every time data write is executed.

As the number of clients using the host 2 increases, the hit rate of the shared device side write buffer is lowered. However, in a case (miss) where the first write data do not exist in the shared device side write buffer, the controller of the flash storage device 3 acquires the first write data from the host 2 by transmitting the transfer request to the host 2. Therefore, even if the number of clients increases, the multi-step write operation such as the foggy fine write operation can be executed normally.

Consequently, the flash storage device 3 can flexibly correspond to the increase in number of clients which share the flash storage device 3 and can reduce the data traffic between the host 2 and the flash storage device 3.

FIG. 2 shows a relationship between plural write buffers provided on the host 2 (i.e., host side write buffers) and a shared write buffer provided in the flash storage device 3 (i.e., shared device side write buffer).

In the host (server) 2, virtual machines 401 corresponding to plural end users (plural clients) respectively are executed. In a hyper-scaler data center, plural clients, for example, several hundreds or thousands of clients often use the host (server) 2. The clients are also called tenants.

The host (server) 2 provides independent service for each client (tenant). In the example of FIG. 2, client #0, client #1, client #2, . . . client #m−1 use the host (server) 2.

An operating system 402 and a user application 403, which are used by the corresponding client (tenant), are run in each of the virtual machines 401.

In addition, plural I/O services 404 corresponding to the plural clients respectively are run in the host (server) 2. The I/O services 404 may include block I/O service, key-value store service, and other various I/O services. Each of the I/O services 404 includes a lookup table (LUT) 404A which is an address translation table for managing mapping between each of the tags for identifying the data and each of the physical addresses of the flash storage device 3. The tag may be a logical address (for example, logical block address: LBA) which designates a location in the logical address space or a key of the key-value store.

For example, in the LBA-based block I/O service, LUT which manages mapping between the logical addresses (LBAs) and the physical addresses of the flash storage device 3 may be used.

In addition, in the key-value store service, LUT which manages mapping between the keys and the physical addresses of the flash storage devices 3 storing the data corresponding to these keys, may be used. In this LUT, correspondence among the tag, the physical address at which data identified by the tag is stored, and a data length of the data may be managed.

Each LUT 404A does not translate each of the tags (for example, LBA) from the user application 403 into LBA for the flash storage device 3, but translates each of the tags (for example, LBA) from the user application 403 into each of the physical addresses of the flash storage device 3.

In addition, in the host (server) 2, plural host side write buffers (#0, #1, #2, . . . , #m−1) 405 corresponding to plural clients (plural clients) #0, #1, #2, . . . , #m−1 respectively are provided. These host side write buffers 405 are provided on the memory included in the host (server) 2.

Each of the host side write buffers 405 is used to temporarily hold the write data from the corresponding client. For example, the write data of the client (tenant) #0 is stored in the host side write buffer #0, the write data of the client (tenant) #1 is stored in the host side write buffer #1, the write data of the client (tenant) #2 is stored in the host side write buffer #2, and the write data of the client (tenant) #m−1 is similarly stored in the host side write buffer #m−1.

The transmission of the command from the host (server) 2 to the flash storage device 3 and the return of a response of command completion or the like from the flash storage device 3 to the host (server) 2 are executed via plural I/O queues 500 corresponding to the plural clients respectively.

The controller of the flash storage device 3 manages plural write destination blocks (flash blocks #0, #1, #2, . . . , #m−1) 602 corresponding respectively to the plural clients (plural tenants) #0, #1, #2, . . . , #m−1 that share the flash storage device 3. In addition, in the flash storage device 3, a shared device side write buffer 601 shared by the plural write destination blocks (flash blocks) 602 is provided. The shared device side write buffer 601 is used to temporarily store the write data which is to be written to any one of the plural write destination blocks (flash blocks #0, #1, #2, . . . , #m−1) 602. In other words, the write data from any one of the clients is stored in the shared device side write buffer 601.

FIG. 3 shows an operation of writing the data to each write destination block, which is executed by the flash storage device 3 by using the shared device side write buffer 601.

It is assumed here that in the flash storage device 3, writing of data to each write destination block is executed by the above-explained foggy fine write operation.

To enable the foggy fine write operation to be supported, each host side write buffer 405 needs to have sufficient capacity.

For example, in a case where the page size is 16 kilobytes, the number of planes per NAND flash memory chip is 2, the number of word lines for writing back and forth is 3, the number of bits written per memory cell is 4 (QLC), and the number of NAND flash memory chips accessed in parallel is 32, the capacity of each host side write buffer 405 is 12 megabytes (=16 kilobytes×2×3×4×32). Since the number of host side write buffers 405 is equal to the number of clients (tenants), the total capacity of the host side write buffers 405 is represented by a product of 12 megabytes and the number of clients (tenants). For example, if the number of clients (tenants) is 1000, the total capacity of host side write buffers 405 is 12 gigabytes.

The write data required to be written by the user application corresponding to the client (tenant) #0 is stored in the host side write buffer (#0) 405, the write data required to be written by the user application corresponding to the client (tenant) #1 is stored in the host side write buffer (#1) 405, and the write data required to be written by the user application corresponding to the client (tenant) #m−1 is similarly stored in the host side write buffer (#m−1) 405.

Each host side write buffer (#m−1) 405 is also used as a cache. Therefore, if the data designated by the read request from a certain client exits in the host side write buffer 405 corresponding to this client, the data may be read from the host side write buffer 405.

The capacity of the shared device side write buffer 601 provided in the flash storage device 3 is determined in accordance with the write speed which is to be implemented. For example, the capacity of the shared device side write buffer 601 may be an arbitrary capacity in a range from 2 megabytes to 3 gigabytes or an arbitrary capacity in a range from 2 megabytes to 4 gigabytes.

In the flash storage device 3, any write data received from the host 2 is stored in the shared device side write buffer 601.

The controller of the flash storage device 3 writes the write data to each of the write destination blocks 602 by the foggy fine write operation.

Each of the write requests received from the host 2 includes a block address designating a write destination block to which write data is to be written. The controller of the flash storage device 3 acquires write data for plural pages (first write data) associated with one or more write requests designating a certain write destination block (for example, write destination block #0 in this case) in the plural write destination blocks 602, as the write data (foggy data) for foggy write operation, from the shared device side write buffer 601. For example, if the page size is 16 kilobytes and 4-bit data are written to one memory cell, the controller of the flash storage device 3 acquires 64-kilobyte write data which are to be written to the write destination block #0, as the foggy data, from the shared device side write buffer 601. The 64-kilobyte write data may be write data associated with one write request including the block address designating the write destination block #0. Alternately, if the size of the write data associated with each write request including the block address designating the write destination block #0 is smaller than 64 kilobytes, the 64-kilobyte write data may be a set of plural write data portions associated with several write requests respectively.

Then, the controller of the flash storage device 3 writes the first write data (foggy data) to plural memory cells (plural first memory cells) connected to one word line of the write target in the write destination block #0, by the foggy write operation.

Similarly, the controller of the flash storage device 3 executes the foggy write operation to one or more subsequent word lines in the write destination block #0.

Then, when the fine write operation of the first write data is to be executed, the controller of the flash storage device 3 requires the first write data of the shared device side write buffer 601. If the first write data exist in the shared device side write buffer 601 (hit), the controller of the flash storage device 3 acquires the first write data from the shared device side write buffer 601 as the write data for fine write operation (fine data). Then, the controller of the flash storage device 3 writes the first write data (fine data) to the above-explained plural first memory cells in the write destination block #0, by the fine write operation.

As for each of the other write destination blocks 602, the foggy fine write operation is executed in the same manner.

The controller of the flash storage device 3 acquires, for example, the write data for plural pages (second write data) associated with one or more write requests designating write destination block #m−1, as the write data for foggy write operation (foggy data), from the shared device side write buffer 601. Then, the controller of the flash storage device 3 writes the second write data (foggy data) to plural memory cells (plural second memory cells) connected to one word line of the write target in the write destination block #m−1, by the foggy write operation.

Similarly, the controller of the flash storage device 3 executes the foggy write operation to one or more subsequent word lines in the write destination block #m−1. Then, when the fine write operation of the second write data is to be executed, the controller of the flash storage device 3 requires the second write data of the shared device side write buffer 601. In the embodiment, when new write data is received from the host 2 in a state in which the shared device side write buffer includes no empty regions, the write data in the shared device side write buffer in which the foggy write operation has been finished is discarded, and an empty region for storing the new write data is thereby secured in the shared device side write buffer 601. The new write data is stored in the secured empty region. In other words, certain write data in the shared device side write buffer 601 in which the foggy write operation has been finished is excluded from the shared device side write buffer 601, and the content of the region in the shared device side write buffer 601 in which the write data has been stored is replaced with the new write data.

Therefore, if the number of clients using the host 2 is comparatively large, the write data which has been used in the foggy write operation for the certain word line may be already discarded at timing at which the fine write operation is to be executed for the certain word line.

If the above-explained second write data do not exist in the shared device side write buffer 601 (miss), the controller of the flash storage device 3 acquires the second write data from the host side write buffer #m−1 of the host 2 as the write data for fine write operation (fine data) by transmitting the request (transfer request) to acquire the second write data, to the host 2. In this case, the second write data is transferred from the host side write buffer #m−1 of the host 2 to the flash storage device 3. The transferred second write data may be stored in the shared device side write buffer 601.

Then, the controller of the flash storage device 3 writes the second write data (fine data) to the above-explained plural second memory cells in the write destination block #m−1, by the fine write operation.

It is assumed here that the capacity of each host side write buffer 405 necessary to support the foggy fine write operation is 12 megabytes and that the total capacity of thousand host side write buffers 405 corresponding to thousand clients (tenants) is 12 gigabytes. In a case where the capacity (total capacity) of the shared device side write buffer 601 is set to 3 gigabytes, if the number of clients (tenants) is 250 or less, the multi-step write operation such as the foggy fine write operation can be executed without transferring the same write data at plural times from the host 2 to the flash storage device 3.

As the number of clients using the host 2 increases, the hit rate of the shared device side write buffer 601 is gradually lowered. However, if the write data which is to be used in the fine write operation does not exist in the shared device side write buffer 601 (miss), the flash storage device 3 acquires the write data from the host 2 by transmitting the transfer request to the host 2. Therefore, even if the number of clients (tenants) increases up to 1000, the multi-step write operation (e.g., foggy fine write operation) can be executed normally.

In addition, even in a case where thousand clients (tenants) exist, for example, if eight flash storage devices 3 are connected to the host (server) 2 and if the host 2 equally allocates the same number of clients to eight flash storage devices 3, each of the flash storage devices 3 can execute the multi-step write operation such as the foggy fine write operation without transferring the same write data at plural times from the host 2 to the flash storage device 3, by merely comprising the 1.5-gigabyte shared device side write buffer 601.

Figure 4:
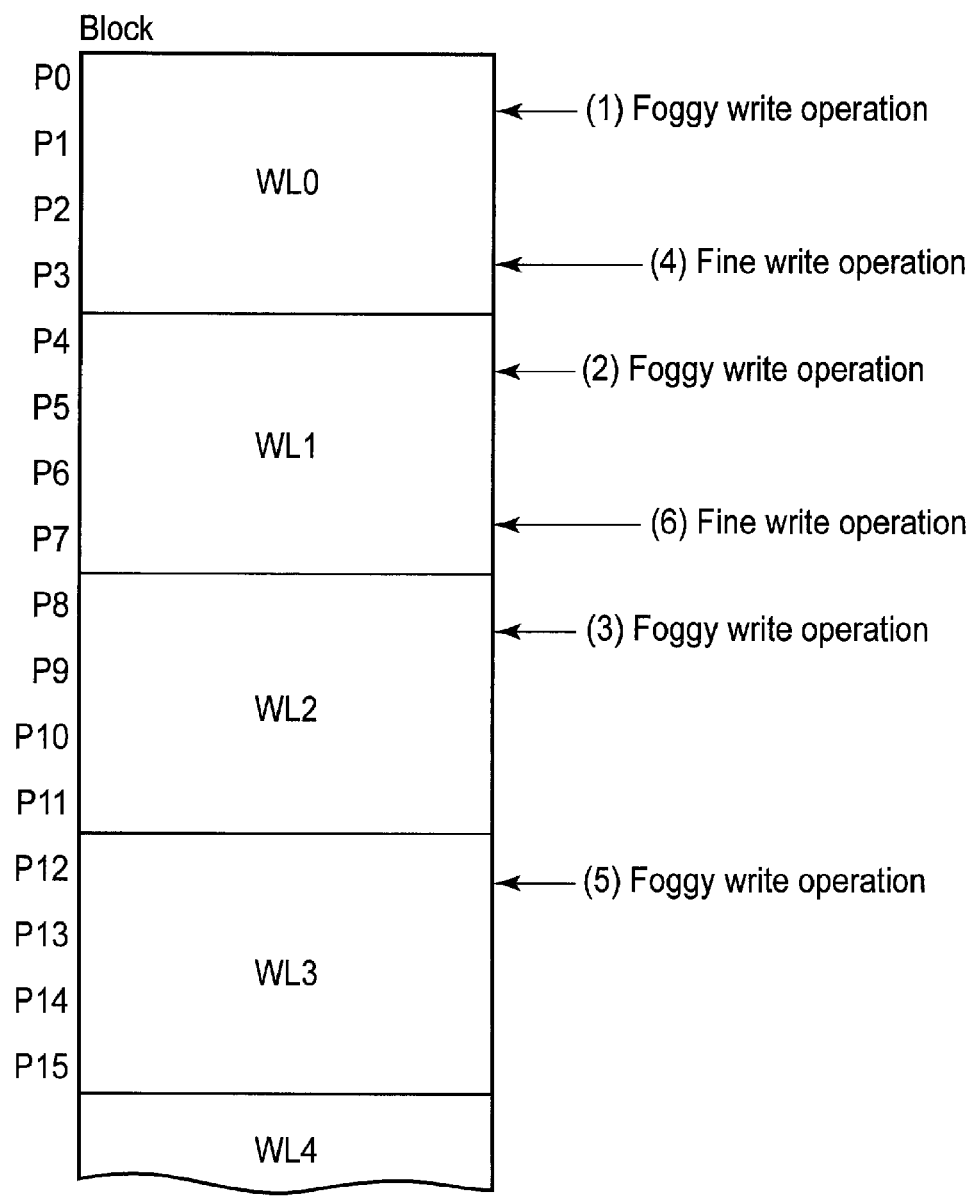
FIG. 4 is a diagram for explanation of a foggy fine write operation in a case of writing in three word lines back and forth.

FIG. 4 shows a foggy fine write operation in a case of writing in three word lines back and forth. It is assumed here that the NAND flash memory in the flash storage device 3 is a QLC-flash which stores 4-bit data per memory cell. The foggy fine write operation for one specific write destination block in a certain NAND flash memory is executed as follows.

(1) First, write data for four pages (P0 to P3) are transferred to the NAND flash memory and the foggy write operation for writing the write data for four pages (P0 to P3) to plural memory cells connected to the word line WL0 in this write destination block is executed.

(2) Next, write data for four pages (P4 to P7) are transferred to the NAND flash memory and the foggy write operation for writing the write data for four pages (P4 to P7) to plural memory cells connected to the word line WL1 in this write destination block is executed.

(3) Next, write data for four pages (P8 to P11) are transferred to the NAND flash memory and the foggy write operation for writing the write data for four pages (P8 to P11) to plural memory cells connected to the word line WL2 in this write destination block is executed.

(4) When the foggy write operation for the plural memory cells connected to the word line WL2 is finished, the word line of the write target returns to the word line WL0 and the fine write operation for the plural memory cells connected to the word line WL0 can be executed. Then, write data for four pages (P0 to P3) that are the same as the write data for four pages (P0 to P3) used in the foggy write operation for the word line WL0 are transferred again to the NAND flash memory, and the fine write operation for writing the write data for four pages (P0 to P3) to the plural memory cells connected to the word line WL0 in the write destination block is executed. The foggy fine write operation for pages P0 to P3 is thereby finished. As a result, the data can be read from pages P0 to P3.

(5) Next, write data for four pages (P12 to P15) are transferred to the NAND flash memory and the foggy write operation for writing the write data for four pages (P12 to P15) to plural memory cells connected to the word line WL3 in this write destination block is executed.

(6) When the foggy write operation for the plural memory cells connected to the word line WL3 is finished, the word line of the write target returns to the word line WL1 and the fine write operation for the plural memory cells connected to the word line WL1 can be executed. Then, write data for four pages (P4 to P7) that are the same as the write data for four pages (P4 to P7) used in the foggy write operation for the word line WL1 are transferred again to the NAND flash memory, and the fine write operation for writing the write data for four pages (P4 to P7) to the plural memory cells connected to the word line WL1 in the write destination block is executed. The foggy fine write operation for pages P4 to P7 is thereby finished. As a result, the data can be read from pages P4 to P7.

FIG. 5 shows a foggy fine write operation in a case of writing in two word lines back and forth. It is assumed here that the NAND flash memory in the flash storage device 3 is a QLC-flash which stores 4-bit data per memory cell. The foggy fine write operation for one specific write destination block in a certain NAND flash memory is executed as follows.

(1) First, write data for four pages (P0 to P3) are transferred to the NAND flash memory and the foggy write operation for writing the write data for four pages (P0 to P3) to plural memory cells connected to the word line WL0 in this write destination block is executed.

(2) Next, write data for four pages (P4 to P7) are transferred to the NAND flash memory and the foggy write operation for writing the write data for four pages (P4 to P7) to plural memory cells connected to the word line WL1 in this write destination block is executed.

(3) When the foggy write operation for the plural memory cells connected to the word line WL1 is finished, the word line of the write target returns to the word line WL0 and the fine write operation for the plural memory cells connected to the word line WL0 can be executed. Then, write data for four pages (P0 to P3) that are the same as the write data for four pages (P0 to P3) used in the foggy write operation for the word line WL0 are transferred again to the NAND flash memory, and the fine write operation for writing the write data for four pages (P0 to P3) to the plural memory cells connected to the word line WL0 in the write destination block is executed. The foggy fine write operation for pages P0 to P3 is thereby finished. As a result, the data can be read from pages P0 to P3.

(4) Next, write data for four pages (P8 to P11) are transferred to the NAND flash memory and the foggy write operation for writing the write data for four pages (P8 to P11) to plural memory cells connected to the word line WL2 in this write destination block is executed.

(5) When the foggy write operation for the plural memory cells connected to the word line WL2 is finished, the word line of the write target returns to the word line WL1 and the fine write operation for the plural memory cells connected to the word line WL1 can be executed. Then, write data for four pages (P4 to P7) that are the same as the write data for four pages (P4 to P7) used in the foggy write operation for the word line WL1 are transferred again to the NAND flash memory, and the fine write operation for writing the write data for four pages (P4 to P7) to the plural memory cells connected to the word line WL1 in the write destination block is executed. The foggy fine write operation for pages P4 to P7 is thereby finished. As a result, the data can be read from pages P4 to P7.

(6) Next, write data for four pages (P12 to P15) are transferred to the NAND flash memory and the foggy write operation for writing the write data for four pages (P12 to P15) to plural memory cells connected to the word line WL3 in this write destination block is executed.

FIG. 6 shows a configuration example of a computing system 1 comprising the host 2 and the flash storage device 3 of the embodiment.

The flash storage device 3 comprises a controller 4 and a nonvolatile memory (NAND flash memory) 5. The flash storage device 3 may comprise a random access memory, for example, a DRAM 6.

The NAND flash memory 5 comprises a memory cell array comprising a plurality of memory cells arranged in a matrix. The NAND flash memory 5 may be a NAND flash memory of a two-dimensional structure or a NAND flash memory of a three-dimensional structure.

The memory cell array of the NAND flash memory 5 includes a plurality of blocks (BLKs) 0 to m−1. Each of blocks BLK0 to BLKm−1 is composed of a number of pages. The erase operation is executed in block units, and the data write operation and the data read operation are executed in page units.

The NAND flash memory 5 may be implemented by a multi-level flash memory which can store plural bits in one memory cell, for example, a quad-level cell (QLC) flash memory which can store 4 bits in one memory cell. In this case, the NAND flash memory 5 can selectively use the write mode (QLC mode) for writing 4 bits to one memory cell and the write mode (single-level cell (SLC) mode) for writing 1 bit to one memory cell. The block to which the QLC mode is applied is referred to as the QLC block, and the block to which the SLC mode is applied is referred to as the SLC block. The above-explained multi-step write operation is used to write data to the QLC block. The NAND flash memory 5 may be implemented by not only the QLC-flash memory, but also a multi-level cell (MLC)-flash memory which can store 2 bits in one memory cell or a triple-level cell (TLC)-flash memory which can store 3 bits in one memory cell. The above-explained multi-step write operation may be used to write the data to a block (MLC block)

to which the MLC mode is applied or may be used to write the data to a block (TLC block) to which the TLC mode is applied.

The controller 4 is electrically connected to the NAND flash memory 5 which is a nonvolatile memory via a NAND interface 13 such as Toggle NAND interface or Open NAND Flash Interface (ONFI). The controller 4 operates as a memory controller configured to control the NAND flash memory 5. The controller 4 may be realized by a circuit such as a system-on-a-chip (SoC).

Figure 7:
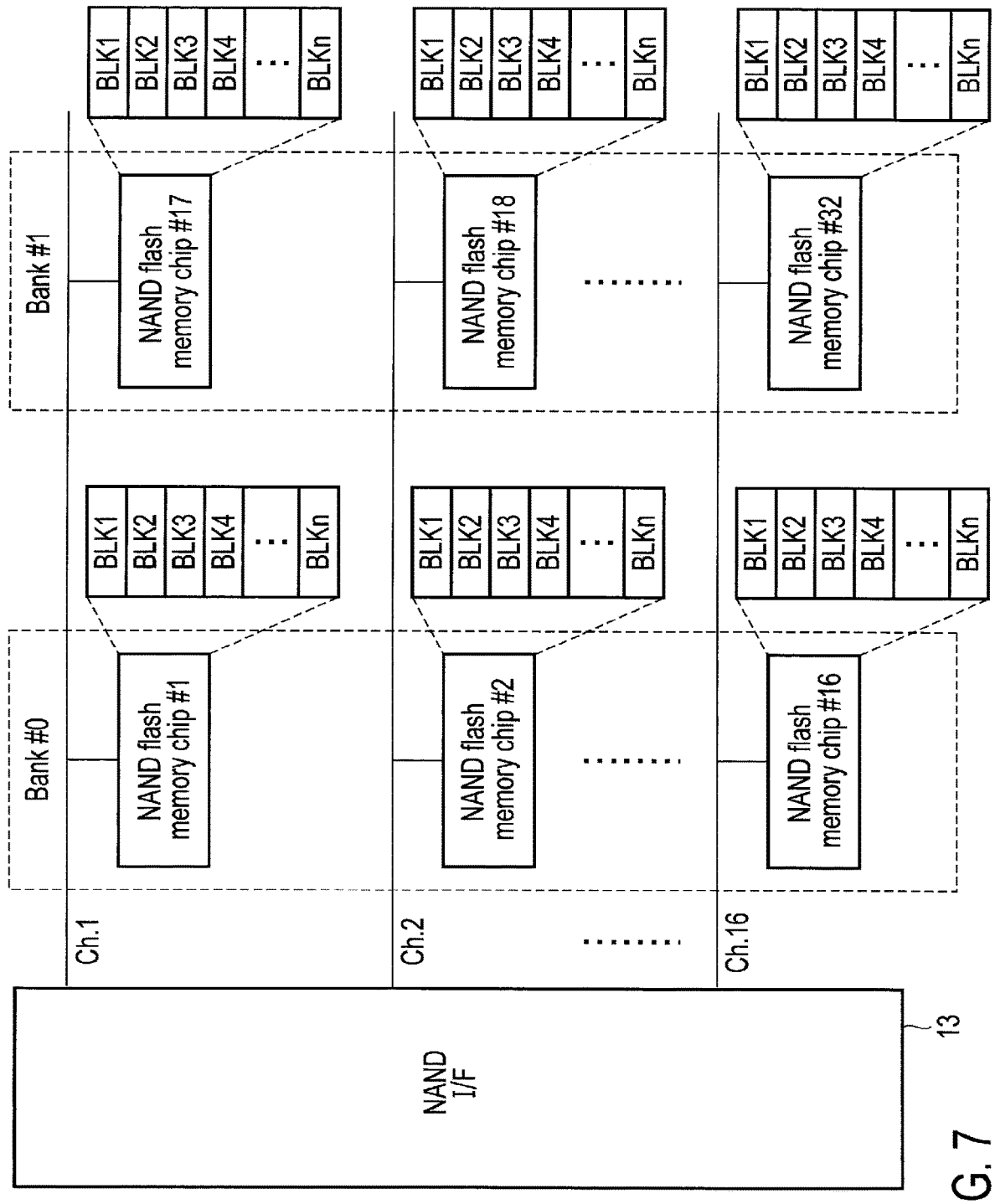
FIG. 7 is a block diagram showing a relationship between plural NAND flash memory chips and plural channels, which are used in the memory system of the embodiment.

As shown in FIG. 7, the NAND flash memory 5 may include a plurality of NAND flash memory chips (NAND flash memory dies). Each of the NAND flash memory chips can operate independently. For this reason, the NAND flash memory chips function as parallel operation units. FIG. 7 shows a case where sixteen channels Ch.1 to Ch.16 are connected to the NAND interface 13, and two NAND flash memory chips are connected to each of sixteen channels Ch.1 to Ch.16. In this case, sixteen NAND flash memory chips #1 to #16 connected to channels Ch.1 to Ch.16 may be organized as bank #0. The remaining sixteen NAND flash memory chips #17 to #32 connected to channels Ch.1 to Ch.16 may be organized as bank #1. The banks function as parallel operation units for operating a plurality of memory modules in parallel by bank interleaving. In the configuration example of FIG. 7, the parallel operation of a maximum number of thirty-two NAND flash memory chips is realized by sixteen channels, and bank interleaving using two banks.

Erase operation may be performed for either each block (physical block) or each super block including a group of blocks which are operable in parallel. Each super block may include thirty-two blocks selected from NAND flash memory chips #1 to #32 one by one although the configuration is not limited to this example. Each of NAND flash memory chips #1 to #32 may comprise a multi-plane structure. For example, when each of NAND flash memory chips #1 to #32 comprises a multi-plane structure including two planes, each super block may include sixty-four blocks in total selected one by one from sixty-four planes corresponding to NAND flash memory chips #1 to #32.

Figure 8:
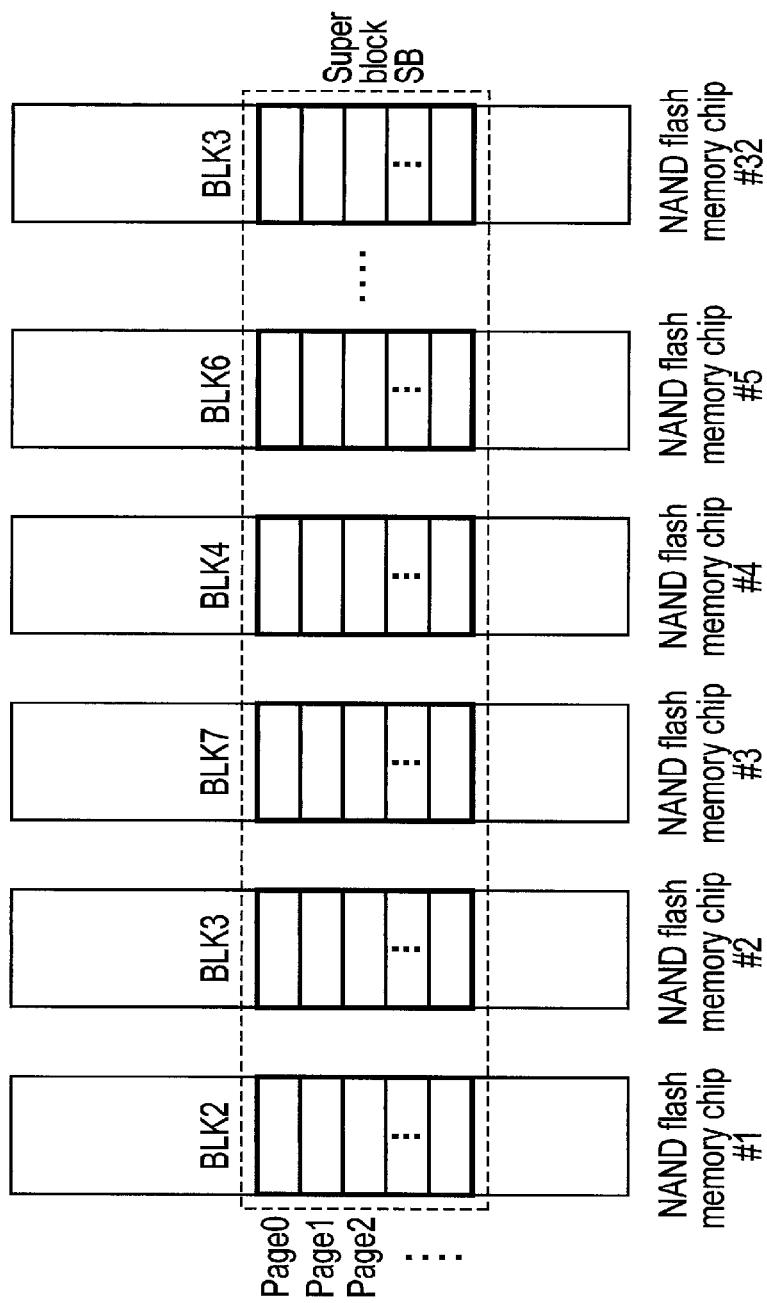
FIG. 8 is a diagram showing a configuration example of a certain super block used in the memory system of the embodiment.

FIG. 8 shows an example of a certain super block SB including thirty-two blocks (block BLK2 in NAND flash memory chip #1, block BLK3 in NAND flash memory chip #2, block BLK7 in NAND flash memory chip #3, block BLK4 in NAND flash memory chip #4, block BLK6 in NAND flash memory chip #5, . . . , block BLK3 in NAND flash memory chip #32).

A super block including a set of plural blocks that can be accessed in parallel may be employed as each of the write destination blocks 602 explained with reference to FIG. 2 and FIG. 3.

Next, the configuration of the controller 4 shown in FIG. 6 will be explained.

The controller 4 comprises a host interface 11, a CPU 12, the NAND interface 13, a DRAM interface 14, and the like. The host interface 11, the CPU 12, the NAND interface 13, and the DRAM interface 14 are interconnected via the bus 10.

The host interface 11 is a host interface circuit configured to perform communication with the host 2. The host interface 11 may be, for example, a PCIe controller (NVMe controller). When the flash storage device 3 is connected to the host 2 via Ethernet (registered trademark), the host interface 11 may be an NVMe over Fabrics (NVMeOF) controller. In the structure in which the flash storage device 3 is connected to the host 2 via Ethernet (registered trademark), the number of storage devices 3 can be easily increased depending on the need. Furthermore, the number of hosts 2 can be easily increased.

The host interface 11 receives various requests (commands) from the host 2. The requests (commands) include a write request (write command), a read request (read command), and the other various requests (commands).

The CPU 12 is a processor configured to control the host interface 11, the NAND interface 13, and the DRAM interface 14. The CPU 12 loads a control program (firmware) from the NAND flash memory 5 or a ROM (not shown) to the DRAM 6 in response to power-on of the flash storage device 3 and executes various processing by executing the firmware. The firmware may be loaded into a SRAM in the controller 4, which is not illustrated in the drawings. The CPU 12 can execute command processing for processing various commands from the host 2, and the like. Operations of the CPU 12 can be controlled by the above-described firmware executed by the CPU 12. A part or all the command processing may be executed by dedicated hardware in the controller 4.

The CPU 12 can function as a write control unit 21 and a read control unit 22. The write control unit 21 and the read control unit 22 may be implemented by dedicated hardware in the controller 4.

The write control unit 21 is configured to write the data to plural memory cells connected to the same word line in a specific write destination block of the NAND flash memory 5, by the multi-step write operation including at least a first-step write operation including a transfer of data for plural pages to the NAND flash memory 5 and a second-step write operation including a transfer of the data to the NAND flash memory 5. One of typical examples of the multi-step write operation is the foggy fine write operation as explained above.

The write control unit 21 manages plural write destination blocks allocated from plural blocks included in the NAND flash memory 5. The write control unit 21 receives the write request designating any one of plural write destination blocks from the host 2. Every time the write control unit 21 receives the write request from the host 2, the write control unit 21 receives the write data stored in any one of plural host side write buffers 405 on the memory 33 in the host 2 and stores the received write data in the shared device side write buffer 601 on the DRAM 6.

The write control unit 21 acquires write data for plural pages (first write data) associated with one or more write requests designating a certain write destination block (first write destination block), from the shared device side write buffer 601. Then, the write control unit 21 writes the first write data to plural memory cells (plural first memory cells) connected to one word line of the write target in the first write destination block, by the first-step write operation such as the foggy write operation.

If the first write data exist in the shared device side write buffer 601 at the time of executing the second-step write operation of the first write data, the write control unit 21 acquires the first write data from the shared device side write buffer 601 and writes the first write data to the above-explained plural first memory cells of the first write destination block by the second-step write operation.

If the first write data do not exist in the shared device side write buffer 601 at the time of executing the second-step write operation of the first write data, the write control unit 21 acquires the first write data from the host 2 by transmitting the request (transfer request) to acquire the first write data to the host 2, and writes the first write data to the above-explained plural first memory cells of the first write destination block by the second-step write operation.

In addition, the write control unit 21 secures an empty region in the shared device side write buffer 601 by discarding write data in the shared device side write buffer 601. For example, when the write control unit 21 finishes the fine write operation of certain write data, i.e., when the write control unit 21 finishes the multi-step write operation of the write data, the write control unit 21 discards the write data in the shared device side write buffer 601.

In addition, when receiving new write data from the host 2 in a state in which the shared device side write buffer 601 includes no empty regions, the write control unit 21 selects the write data which is to be discarded, from the write data in the shared device side write buffer 601 in which the foggy write operation has been finished, and discards the selected write data in the shared device side write buffer 601.

As an algorithm for selecting the write data which is to be discarded, first-in first-out of selecting the oldest write data, of the write data in the shared device side write buffer 601 in which the first-step write operation such as the foggy write operation has been finished, can be employed.

A progress speed of the data write operation to the write destination block corresponding to the client (tenant) in which an amount of writing of data is large tends to be higher than a progress speed of the data write operation to the write destination block corresponding to the client (tenant) in which an amount of writing of data is small. For this reason, frequency of transmitting the transfer request to the host 2 can be reduced by employing the method of discarding the oldest write data, of the write data in the shared device side write buffer 601 in which the first-step write operation such as the foggy write operation has been finished.

An algorithm for selecting the write data which is to be discarded, of the write data in the shared device side write buffer 601 in which the first-step write operation such as the foggy write operation has been finished, is not limited to the first-in first-out, but the other algorithms such as LRU, random and the like may be employed.

The read control unit 22 receives the read request (read command) designating a block address and a page address from the host 2, reads the data stored in the physical storage location in the NAND flash memory 5 which is designated by the block address and the page address, and returns the read data to the host 2.

The NAND interface 13 is a memory control circuit configured to control the NAND flash memory 5 under the control of the CPU 12.

The DRAM interface 14 is a DRAM control circuit configured to control the DRAM 6 under the control of the CPU 12. A part of the memory region of the DRAM 6 is used as a shared device side write buffer 601.

The host 2 is a computer such as a server and comprises a host storage controller 31, a processor 32, and a memory 33 as its hardware components. The host storage controller 31, the processor 32, and the memory 33 may be interconnected via a bus 30. The memory 33 is a random-access memory such as DRAM, and a part of a memory region of the memory 33 is used as the host side write buffers 405.

The host 2 may further comprise a network interface 34.

FIG. 9 shows an example of data write processing executed by the host 2 and the flash storage device 3.

It is assumed here that at timing of executing the fine write operation for a certain word line in a certain write destination block, the write data which are to be written to plural memory cells connected to this word line exist in the shared device side write buffer 601.

(1) When a user application corresponding to a certain client (tenant) requires data write, the data (write data) is stored in the host side write buffer 405 corresponding to the client (tenant). A write request is transmitted from the host 2 to the flash storage device 3. The write request may include, for example, a block address and a tag. As explained above, the tag is the information (for example, LBA, a key of key-value store, and the like) to identify the write data. In addition, the write request may include storage location information indicative of the location in the host side write buffer 405 in which the write data are stored. For example, the write request may be transmitted from the host 2 to the flash storage device 3 when the condition that a predetermined amount of write data is stored in the host side write buffer 405 is met. When the write control unit 21 receives the write request from the host 2, in the controller 4 of the flash storage device 3, the write control unit 21 receives the write data stored in the host side write buffer 405 from the host 2. The write data may be transmitted from the host 2 to the flash storage device 3 together with the write request or the write control unit 21 may acquire the write data from the host 2 by transmitting a request (transfer request) to acquire the write data to the host 2. This transfer request includes the above-explained storage location information indicative of the location in the host side write buffer 405.

(2), (3) In the controller 4 of the flash storage device 3, the write control unit 21 determines the page address of the page of write target in the write destination block designated by the block address in the received write request. The write control unit 21 acquires the first write data for plural pages which are to be written to the write destination block from the shared device side write buffer 601. The write control unit 21 writes the first write data for plural pages to the write destination block via the NAND interface 13, by the foggy write operation. In this case, the write control unit 21 transfers the first write data for plural pages (foggy data) to the NAND flash memory chip including this write destination block, and writes the first write data to plural first memory cells connected to the word line of write target in this write destination block (foggy write operation).

(4) When the time to execute the fine write operation of the first write data comes by finishing the foggy write operation to one or more subsequent word lines, the write control unit 21 requires the first write data for plural pages of the shared device side write buffer 601. If the first write data for plural pages exist in the shared device side write buffer 601, the write control unit 21 acquires the first write data for plural pages from the shared device side write buffer 601. The write control unit 21 writes the first write data for plural pages to the write destination block via the NAND interface 13, by the fine write operation. In this case, the write control unit 21 transfers the first write data for plural pages (fine data) to the NAND flash memory chip including the write destination block, and writes the first write data to the above-explained plural first memory cells in the write destination block (fine write operation).

(5) The write control unit 21 discards the first write data for plural pages in which the fine write operation has been finished (fine-state write data) from the shared device side write buffer 601, and thereby increases the empty regions in the shared device side write buffer 601.

FIG. 10 shows another example of data write processing executed by the host 2 and the flash storage device 3.

It is assumed here that at timing of executing the fine write operation for a certain word line in a certain write destination block, the write data which are to be written to plural memory cells connected to this word line do not exist in the shared device side write buffer 601.

(1') When a user application corresponding to a certain client (tenant) requires data write, the data (write data) is stored in the host side write buffer 405 corresponding to the client (tenant). A write request is transmitted from the host 2 to the flash storage device 3. The write request may include, for example, a block address and a tag. As explained above, the tag is the information (for example, LBA, a key of key-value store, and the like) to identify the write data. In addition, the write request may include storage location information indicative of the location in the host side write buffer 405 in which the write data are stored. For example, the write request may be transmitted from the host 2 to the flash storage device 3 when the condition that a predetermined amount of write data is stored in the host side write buffer 405 is met. When the write control unit 21 receives the write request from the host 2, in the controller 4 of the flash storage device 3, the write control unit 21 receives the write data stored in the host side write buffer 405 from the host 2. The write data may be transmitted from the host 2 to the flash storage device 3 together with the write request or the write control unit 21 may acquire the write data from the host 2 by transmitting a request (transfer request) to acquire the write data to the host 2. This transfer request includes the above-explained storage location information indicative of the location in the host side write buffer 405.

(2'), (3') In the controller 4 of the flash storage device 3, the write control unit 21 determines the page address of the page of write target in the write destination block designated by the block address in the received write request. The write control unit 21 acquires the first write data for plural pages which are to be written to the write destination block from the shared device side write buffer 601. The write control unit 21 writes the first write data for plural pages to the write destination block via the NAND interface 13, by the foggy write operation. In this case, the write control unit 21 transfers the first write data for plural pages (foggy data) to the NAND flash memory chip including this write destination block, and writes the first write data to plural first memory cells connected to the word line of write target in this write destination block (foggy write operation).

(4') When the time to execute fine write of the first write data comes by finishing the foggy write operation to one or more subsequent word lines, the write control unit 21 requires the first write data for plural pages of the shared device side write buffer 601. If the first write data for plural pages do not exist in the shared device side write buffer 601, the write control unit 21 acquires the first write data from the host 2 by transmitting a request (transfer request) to acquire the first write data to the host 2. This transfer request includes the above-explained storage location information indicative of the location in the host side write buffer 405. The acquired first write data may be stored in the shared device side write buffer 601.

(5') The write control unit 21 writes the first write data for plural pages to the write destination block via the NAND interface 13, by the fine write operation. In this case, the write control unit 21 transfers the first write data for plural pages (fine data) to the NAND flash memory chip including the write destination block, and writes the first write data to the above-explained plural first memory cells in the write destination block (fine write operation).

(6') The write control unit 21 discards the first write data for plural pages in which the fine write operation has been finished (fine-state write data) from the shared device side write buffer 601, and thereby increases the empty regions in the shared device side write buffer 601.

FIG. 11 shows the foggy fine write operation and processing of discarding the data of the shared device side write buffer 601, which are executed by the controller 4 of the flash storage device 3 using the shared device side write buffer 601.

FIG. 11 shows an example that the shared device side write buffer 601 includes regions 101 to 109, to simplify the illustration. Each of the regions 101 to 109 has, for example, a size for four pages. In addition, in FIG. 11, it is assumed that the foggy fine write operation is executed while writing in three word lines WL back and forth.

If write data D1 and D2 stored in the respective regions 101 and 102 of the shared device side write buffer 601 are the write data which are to be written to the write destination block BLK11, the controller 4 (1) writes the write data D1 for four pages to pages P0 to P3 of the write destination block BLK11 (i.e., plural memory cells connected to the word line WL0) by the foggy write operation, and (2) writes the write data D2 for four pages to pages P4 to P7 of the write destination block BLK11 (i.e., plural memory cells connected to the word line WL1) by the foggy write operation.

If write data D11, D12, and D13 stored in the regions 103, 104, and 105 of the shared device side write buffer 601 are the write data which are to be written to the write destination block BLK101, the controller 4 (3) writes the write data D11 for four pages to pages P0 to P3 of the write destination block BLK101 (i.e., plural memory cells connected to the word line WL0) by the foggy write operation, (4) writes the write data D12 for four pages to pages P4 to P7 of the write destination block BLK101 (i.e., plural memory cells connected to the word line WL1) by the foggy write operation, and (5) writes the write data D13 for four pages to pages P8 to P11 of the write destination block BLK101 (i.e., plural memory cells connected to the word line WL2) by the foggy write operation.

After the foggy write operation of the write data D13 for four pages to the word line WL2 is finished, the controller 4 (6) writes the write data D11 for four pages to pages P0 to P3 of the write destination block BLK101 (i.e., plural memory cells connected to the word line WL0) by the fine write operation. When the fine write operation of the write data D11 is finished, the state of the write data D11 is changed from the foggy state to the fine state. Then, the controller 4 (7) discards the write data D11 in which the fine write operation has been finished (fine-state write data) from the shared device side write buffer 601 to set the region 103 to an empty region.

FIG. 12 shows processing of discarding the write data in the shared device side write buffer 601 in which the fine write operation has been finished. This processing is executed when new write data is received from the host 2 in a state in which no empty regions exist in the shared device side write buffer 601.

An upper part of FIG. 12 shows a state in which the whole shared device side write buffer 601 is filled with the foggy-state write data (D21 to D23, D31 to D33, and D41 to D43) in which the foggy write operation has been finished, and no empty regions exist in the shared device side write buffer 601.

When receiving new write data from the host 2 in this state, the controller 4 of the flash storage device 3 selects the oldest write data (i.e., write data D11 in this example) among the write data (foggy-state write data) in which the foggy write operation has been finished, as the write data which is to be discarded, and discards the oldest write data (i.e., write data D11 in this example) in the shared device side write buffer 601, as shown at a middle part of FIG. 12.

Then, the controller 4 of the flash storage device 3 stores the received new write data (i.e., write data D51 in this example) in region 101 which becomes an empty region by discarding the write data D11, as shown at a lower part of FIG. 12.

The flowchart of FIG. 13 shows a procedure of data write processing executed by the controller 4 of the flash storage device 3.

In step S101, the controller 4 receives the write request including the block address designating any one of plural write destination blocks 602, from the host 2. Every time the controller 4 receives the write request from the host 2, the controller 4 receives the write data stored in any one of plural host side write buffers 405 and stores the received write data in the shared device side write buffer 601.

In step S102, the controller 4 acquires the first write data for plural pages associated with one or more write requests designating a certain write destination block, from the shared device side write buffer 601.

In steps S103 and S104, the controller 4 transfers the acquired first write data for plural pages to the NAND flash memory 5, and writes the first write data to the plural first memory cells connected to one word line of write target in the write destination block, by the foggy write operation.

In step S105, at the timing of starting the fine write operation of the first write data, the controller 4 determines whether the first write data exists in the shared device side write buffer 601 or not.

If the first write data exists in the shared device side write buffer 601 (YES in step S106), the controller 4 acquires the first write data from the shared device side write buffer 601 in step S107. In steps S108 and S109, the controller 4 transfers the acquired first write data for plural pages to the NAND flash memory 5, and writes the first write data to the plural first memory cells in the write destination block, by the fine write operation. In step S110, the controller 4 discards the first write data from the shared device side write buffer 601.

If the first write data do not exist in the shared device side write buffer 601 (NO in step S106), the controller 4 transmits the transfer request to the host 2, and stores the first write data transferred from the host side write buffer 405 to the flash storage device 3, in the shared device side write buffer 601, in step S111. Then, the controller 4 executes the processing in steps S107 to S110.

Figure 14:
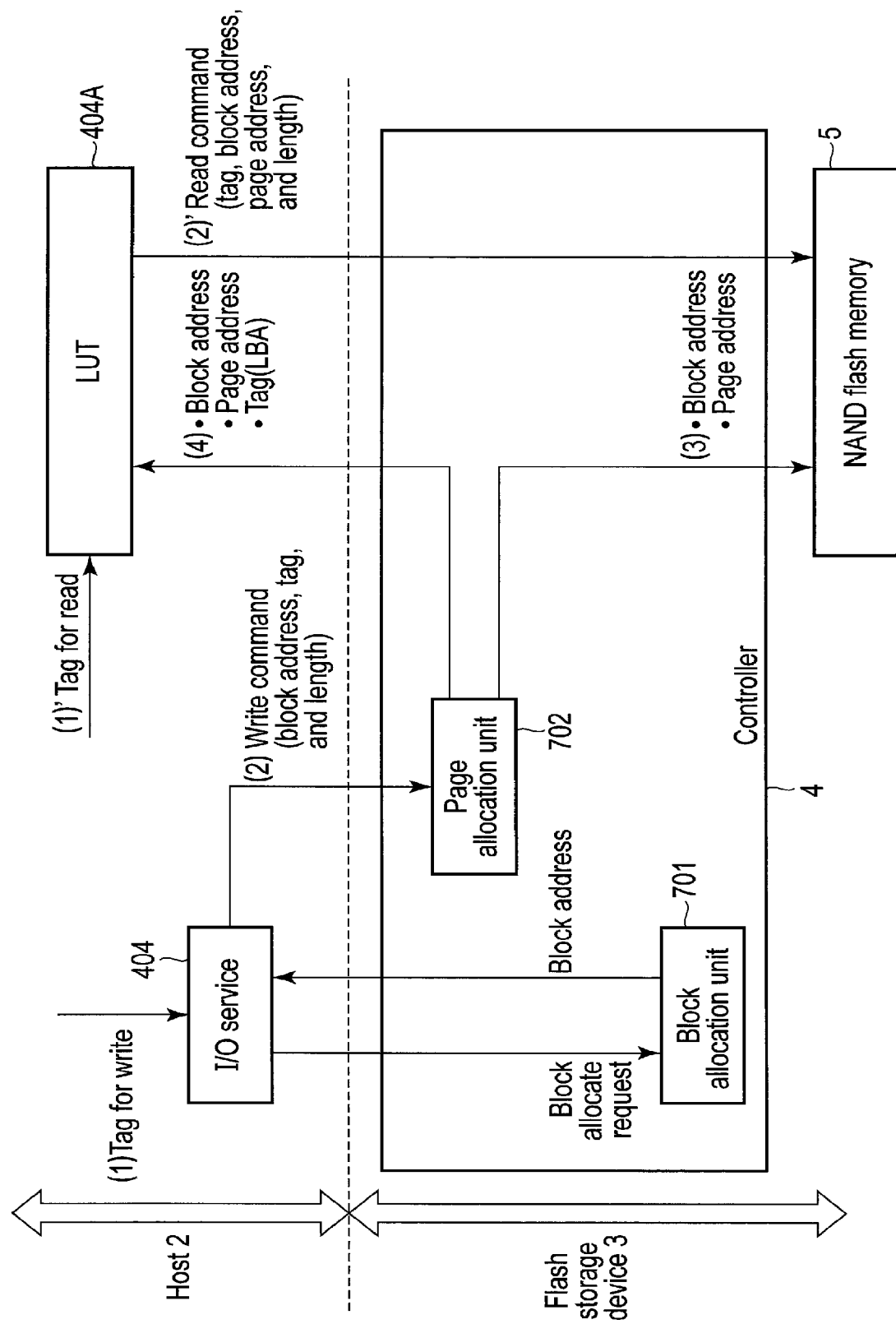
FIG. 14 is a diagram for explanation of data write processing of designating a write destination block by the host and determining a write destination page by the memory system of the embodiment, and data read processing of designating a block address and a page address by the host.

FIG. 14 is a diagram showing a data write operation of designating the write destination block by the host 2 and determining the write destination page by the flash storage device 3, and a data read operation of designating the block address and the page address by the host 2.

The I/O service 404 of the host 2 transmits the block allocate request and the write request to the flash storage device 3.

The controller 4 of the flash storage device 3 comprises a block allocation unit 701 and a page allocation unit 702. The block allocation unit 701 and the page allocation unit 702 may be included in the write control unit 21 explained with reference to FIG. 6.

The data write operation is executed in the following procedure.

(1) When the I/O service 404 of the host 2 needs to write the data (write data) to the flash storage device 3, the I/O service 404 may require the flash storage device 3 to allocate a free block available as the write destination block. When the block allocation unit 701 receives this request (block allocate request), the block allocation unit 701 allocates one free block of the free blocks to the host 2 as the write destination block, and notifies the host 2 of the block address (BLK #) of the allocated write destination block.

(2) The I/O service 404 of the host 2 transmits the write request which includes a block address designating the allocated write destination block, a tag identifying the write data, and a data length of the write data, to the flash storage device 3. In addition, the I/O service 404 transfers the write data to the flash storage device 3.

(3) When the page allocation unit 702 receives the write request, the page allocation unit 702 determines a page address indicative of the write destination page in the block (write destination block) having the block address designated by the write request. The controller 4 acquires the write data from the shared device side write buffer 601 and writes the write data to the determined write destination page in the write destination block.

(4) The controller 4 notifies the host 2 of the page address indicative of the write destination page as a response to the write request. Alternatively, the controller 4 may notify the host 2 of a set of the tag included in the write request, the block address included in the write request, and the determined page address as a response to the write request. In the host 2, LUT 404A is updated such that the physical address (block address and page address) indicative of the physical storage location to which the write data is written is mapped to the tag of the write data.

The data read operation is executed in the following procedure.

(1') When the host 2 needs to read the data from the flash storage device 3, the host 2 acquires the physical address (block address or page address) corresponding to the tag of the data to be read, from LUT 404A, by referring to LUT 404A.

(2') The host 2 transmits the read request designating the acquired block address and page address to the flash storage device 3. When the controller 4 of the flash storage device 3 receives the read request from the host 2, the controller 4 reads the data from the physical storage location to be read in the block to be read, based on the block address and the page address.

FIG. 15 shows a block allocate command applied to the flash storage device 3.

The block allocate command is a command (block allocate command) to require the flash storage device 3 to allocate the write destination block (free block). The host 2 can require the flash storage device 3 to allocate the write destination block and thereby acquire the block address (i.e., the block address of the allocated write destination block), by transmitting the block allocate command to the flash storage device 3.

FIG. 16 shows a response to the block allocate command.

When the flash storage device 3 receives the block allocate command from the host 2, the flash storage device 3 selects the free block which should be allocated to the host 2, of a free block list for managing free blocks of the NAND flash memory 5, allocates the selected free block as the write destination block, and returns the response including the block address of this write destination block to the host 2.

FIG. 17 shows a write command applied to the flash storage device 3.

The write command is a command to require the flash storage device 3 to write data. This write command may include the command ID, the block address, the tag, the length, and the like.

The command ID is an ID (command code) indicating that this command is the write command, and the command ID for the write command is included in the write command.

The block address is a physical address designating a write destination block to which the data should be written.

The tag is an identifier for identifying write data which should be written. This tag may be a logical address such as LBA or a key of a key-value store as explained above. If the tag is the logical address such as LBA, the logical address (starting LBA) included in this write command is indicative of a logical location (first logical location) in the logical address space to which the write data should be written.

The length is indicative of the length of the write data to be written.

The write command may include storage location information indicative of the location in the host side write buffer 405 in which the write data are stored.

When the controller 4 receives the write command from the host 2, the controller 4 determines the write destination location (write destination page) in the write destination block having the block address designated by the write command. The write destination page is determined in consideration of the restrictions on page write order, the bad pages, and the like. Then, the controller 4 writes the data from the host 2 to the write destination location (write destination page) in the write destination block.

FIG. 18 shows a response to the write command shown in FIG. 17.

This response includes the page address and the length. The page address is a physical address indicative of the physical storage location in the write destination block to which the data has been written. This physical address may be represented by an in-block offset (i.e., a set of the page address and the in-page offset). The length is indicative of the length of the written data.

Alternatively, this response may further include not only the page address (in-block offset) and the length, but also the tag and the block address. The tag is the tag included in the write command shown in FIG. 17. The block address is the block address included in the write command shown in FIG. 17.

FIG. 19 shows a read command applied to the flash storage device 3.

The read command is a command to require the flash storage device 3 to read the data. This read command includes the command ID, the tag, the block address, the page address, and the length.

The command ID is an ID (command code) indicating that this command is the read command, and the command ID for the read command is included in the read command.

The block address is indicative of a block storing the data which should be read. The page address is indicative of a page storing the data which should be read. This page address may be represented by an in-block offset (i.e., a set of the page address and the in-page offset) indicative of the physical storage location in the block storing the data which should be read. The length is indicative of the length of the data to be read.

FIG. 20 shows an example of the shared device side write buffer 601 implemented by one or more SLC-blocks.

In the above explanations, the shared device side write buffer 601 is assumed to be implemented by the random-access memory such as DRAM 6. However, since the data write speed of the SLC-block to which data of 1 bit per memory cell is written is higher than the data write speed of the block to which data of plural bits per memory cell is written, the shared device side write buffer 601 may be implemented by one or more SLC-blocks to which data of 1 bit per memory cell is written as shown in FIG. 20. In this case, each of the write destination blocks may be implemented by the block to which the data of plural bits per memory cell are written, for example, the QLC block where data of 4 bits per memory cell are written.

As explained above, according to the embodiments, every time the write request is received from the host 2, the write data stored in any one of plural host side write buffers 405 corresponding to the plural write destination blocks 602 respectively is stored in the shared device side write buffer 601 shared by the plural write destination blocks 602. Then, the first write data for plural pages which are to be written to the first write destination block in the plural write destination blocks 602 are acquired from the shared device side write buffer 601, and the first write data are written to the first write destination block by the first-step write operation such as the foggy write operation. If the write data are received from the host 2 in a state in which no empty regions exist in the shared device side write buffer 601, the write data in the shared device side write buffer 601 in which the first-step write operation has been finished is discarded, and thereby the empty region is secured in the shared device side write buffer 601. If the first write data do not exist in the shared device side write buffer 601 at the time when the second-step write operation such as the fine write operation of the first write data is to be executed, the first write data is acquired from the host 2 by transmitting a request for acquiring the first write data to the host 2.

Therefore, since the same write data are transferred again from the host 2 to the flash storage device 3 only when the first write data do not exist in the shared device side write buffer 601, the embodiment can flexibly correspond to the increase in write destination blocks, i.e., increase in number of clients sharing the flash storage device 3, and the data traffic between the host 2 and the flash storage device 3 can be reduced.

In the embodiments, the multi-step write operation such as the foggy fine write operation is executed by using the shared device side write buffer 601, but the configuration of the embodiment and the procedure of the write processing can be applied to not only the multi-step write operation, but also a full-sequence write operation of transferring the data for plural pages to the NAND flash memory 5 at only one time.

In addition, in the embodiments, the write request (write command) including the block address designating the write destination block is explained as the write command applied to the flash storage device 3, but the write request (write command) including both of the block address and the page address may be used as the write command applied to the flash storage device 3.

In the present embodiment, a NAND flash memory is exemplarily shown as a nonvolatile memory. However, the functions of the present embodiment are also applicable to various other nonvolatile memories such as a magnetoresistive random access memory (MRAM), a phase change random access memory (PRAM), a resistive random access memory (ReRAM) and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the host including a data buffer, the memory system comprising:
   a nonvolatile memory including a plurality of word lines, the plurality of word lines including at least a first word line and a second word line, each of the plurality of word lines connecting a plurality of memory cells;
   a write buffer; and
   a controller electrically connected to the nonvolatile memory and configured to execute a multi-step write operation for writing data to the nonvolatile memory, the multi-step write operation including at least a first-step write operation and a second-step write operation, wherein
   the controller is further configured to:
   transfer first data from the data buffer of the host to the write buffer;
   transfer the first data from the write buffer to the nonvolatile memory;
   execute the first-step write operation for the first data on the plurality of memory cells connected to the first word line;
   transfer second data from the data buffer of the host to the write buffer;
   transfer the second data from the write buffer to the nonvolatile memory;
   execute the first-step write operation for the second data on the plurality of memory cells connected to the second word line; and
   in executing the second-step write operation for the first data,
   determine that the first data is not stored in the write buffer;
   in response to determining that the first data is not stored in the write buffer, transfer the first data from the data buffer of the host to the write buffer again;
   transfer the first data from the write buffer to the nonvolatile memory again; and
   execute the second-step write operation for the first data on the plurality of memory cells connected to the first word line.

2. The memory system of claim 1, wherein
   the controller is further configured to:
   in executing the second-step write operation for the first data,
   determine that the first data is stored in the write buffer;
   in response to determining that the first data is stored in the write buffer, transfer the first data from the write buffer to the nonvolatile memory again, without transferring the first data from the data buffer of the host to the write buffer again; and
   execute the second-step write operation for the first data on the plurality of memory cells connected to the first word line.

3. The memory system of claim 1, wherein
   the controller is further configured to:
   determine that the write buffer which stores the first data includes no available space for storing the second data; and
   in response to determining that the write buffer which stores the first data includes no available space for storing the second data, discard the first data from the write buffer before transferring the second data from the data buffer of the host to the write buffer.

4. The memory system of claim 1, wherein
   the controller is further configured to:
   determine that the write buffer includes no available space for storing third data; and
   in response to determining that the write buffer includes no available space for storing the third data, discard oldest data from the write buffer, among data in the write buffer for which the first-step write operation has been finished.

5. The memory system of claim 1, wherein
   the controller is further configured to:
   determine that the write buffer includes no available space for storing third data; and
   in response to determining that the write buffer includes no available space for storing the third data, discard least recently used data from the write buffer, among data in the write buffer for which the first-step write operation has been finished.

6. The memory system of claim 1, wherein
   the controller is further configured to:
   discard the first data from the write buffer after the second-step write operation for the first data is finished.

7. The memory system of claim 1, wherein
   the nonvolatile memory further includes a plurality of blocks, each of the plurality of blocks being a unit of a data erase operation, the plurality of blocks including at least a first block and a second block, the first block including the first word line, the second block including the second word line,
   the data buffer of the host includes a plurality of regions respectively corresponding to the plurality of blocks, the plurality of regions including at least a first region and a second region, and
   the controller is further configured to:
   transfer the first data from the first region of the data buffer to the write buffer by transmitting a request to the host, the first region corresponding to the first block; and
   transfer the second data from the second region of the data buffer to the write buffer by transmitting another request to the host, the second region corresponding to the second block.

8. The memory system of claim 1, wherein
the first-step write operation includes an operation for programming data having a first size to the plurality of memory cells connected to one word line of the plurality of word lines to set a threshold voltage distribution of the plurality of memory cells connected the one word line,
the second-step write operation includes an operation for programming the data having the first size to the plurality of memory cells connected to the one word line to adjust the threshold voltage distribution of the plurality of memory cells connected the one word line.

9. The memory system of claim 1, wherein
the write buffer is implemented with a random-access memory.

10. The memory system of claim 1, wherein
the nonvolatile memory further includes a plurality of blocks, each of the plurality of blocks being a unit of a data erase operation, the plurality of blocks including at least a first block and a second block, the first block including the first word line and the second word line,
at least one memory cell in the first block is configured to store a first number of bits of data,
at least one memory cell in the second block is configured to store a second number of bits of data, the second number being smaller than the first number, and
the write buffer is implemented with the second block.

11. A method of controlling a nonvolatile memory in a memory system, the memory system being connectable to a host that includes a data buffer, the memory system including a write buffer and the nonvolatile memory, the nonvolatile memory including a plurality of word lines, the plurality of word lines including at least a first word line and a second word line, each of the plurality of word lines connecting a plurality of memory cells, said method comprising:
transferring first data from the data buffer of the host to the write buffer;
transferring the first data from the write buffer to the nonvolatile memory;
executing a first-step write operation for the first data on the plurality of memory cells connected to the first word line, the first-step write operation being one operation of a multi-step write operation for writing data to the nonvolatile memory;
transferring second data from the data buffer of the host to the write buffer;
transferring the second data from the write buffer to the nonvolatile memory;
executing the first-step write operation for the second data on the plurality of memory cells connected to the second word line; and
in executing a second-step write operation for the first data, the second-step write operation being another one operation of the multi-step write operation,
determining that the first data is not stored in the write buffer;
in response to determining that the first data is not stored in the write buffer, transferring the first data from the data buffer of the host to the write buffer again;
transferring the first data from the write buffer to the nonvolatile memory again; and
executing the second-step write operation for the first data on the plurality of memory cells connected to the first word line.

12. The method of claim 11, further comprising:
in executing the second-step write operation for the first data,
determining that the first data is stored in the write buffer;
in response to determining that the first data is stored in the write buffer, transferring the first data from the write buffer to the nonvolatile memory again, without transferring the first data from the data buffer of the host to the write buffer again; and
executing the second-step write operation for the first data on the plurality of memory cells connected to the first word line.

13. The method of claim 11, further comprising:
determining that the write buffer which stores the first data includes no available space for storing the second data; and
in response to determining that the write buffer which stores the first data includes no available space for storing the second data, discarding the first data from the write buffer before transferring the second data from the data buffer of the host to the write buffer.

14. The method of claim 11, further comprising:
determining that the write buffer includes no available space for storing third data; and
in response to determining that the write buffer includes no available space for storing the third data, discarding oldest data from the write buffer, among data in the write buffer for which the first-step write operation has been finished.

15. The method of claim 11, further comprising:
determining that the write buffer includes no available space for storing third data; and
in response to determining that the write buffer includes no available space for storing the third data, discarding least recently used data from the write buffer, among data in the write buffer for which the first-step write operation has been finished.

16. The method of claim 11, further comprising:
discarding the first data from the write buffer after the second-step write operation for the first data is finished.

17. The method of claim 11, wherein
the nonvolatile memory further includes a plurality of blocks, each of the plurality of blocks being a unit of a data erase operation, the plurality of blocks including at least a first block and a second block, the first block including the first word line, the second block including the second word line,
the data buffer of the host includes a plurality of regions respectively corresponding to the plurality of blocks, the plurality of regions including at least a first region and a second region, and
said method further comprises:
transferring the first data from the first region of the data buffer to the write buffer by transmitting a request to the host, the first region corresponding to the first block; and
transferring the second data from the second region of the data buffer to the write buffer by transmitting another request to the host, the second region corresponding to the second block.

18. The method of claim 11, wherein
the first-step write operation includes an operation for programming data having a first size to the plurality of memory cells connected to one word line of the plurality of word lines to set a threshold voltage distribution of the plurality of memory cells connected the one word line,
the second-step write operation includes an operation for programming the data having the first size to the plurality of memory cells connected to the one word line to adjust the threshold voltage distribution of the plurality of memory cells connected the one word line.

19. The method of claim 11, wherein
the write buffer is implemented with a random-access memory.

20. The method of claim 11, wherein
the nonvolatile memory further includes a plurality of blocks, each of the plurality of blocks being a unit of a data erase operation, the plurality of blocks including at least a first block and a second block, the first block including the first word line and the second word line,
at least one memory cell in the first block is configured to store a first number of bits of data,
at least one memory cell in the second block is configured to store a second number of bits of data, the second number being smaller than the first number, and
the write buffer is implemented with the second block.

\* \* \* \* \*